United States Patent
Janesch

(10) Patent No.: US 7,898,343 B1
(45) Date of Patent: Mar. 1, 2011

(54) FREQUENCY-LOCKED LOOP CALIBRATION OF A PHASE-LOCKED LOOP GAIN

(75) Inventor: Stephen T. Janesch, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 112 days.

(21) Appl. No.: 12/341,638

(22) Filed: Dec. 22, 2008

Related U.S. Application Data

(60) Provisional application No. 61/015,751, filed on Dec. 21, 2007.

(51) Int. Cl.
 *H03L 7/00* (2006.01)
(52) U.S. Cl. ............... 331/16; 331/11; 331/17; 331/25; 331/34; 331/44
(58) Field of Classification Search .......... 331/11, 331/16, 17, 25, 34
See application file for complete search history.

(56) References Cited

U.S. PATENT DOCUMENTS

| 3,538,450 | A | 11/1970 | Andrea et al. |
| 5,493,715 | A | 2/1996 | Humphreys et al. |
| 6,710,664 | B2 | 3/2004 | Humphreys et al. |
| 6,724,265 | B2 | 4/2004 | Humphreys |
| 7,023,282 | B1 | 4/2006 | Humpreys et al. |
| 7,064,591 | B1 | 6/2006 | Humphreys et al. |
| 7,098,754 | B2 | 8/2006 | Humphreys et al. |
| 2001/0052823 | A1* | 12/2001 | Hirano et al. .......... 331/11 |
| 2002/0075080 | A1* | 6/2002 | Nelson et al. .......... 331/11 |
| 2003/0048139 | A1* | 3/2003 | Chien et al. ........... 331/11 |

OTHER PUBLICATIONS

Kral, A. et al., "RF-CMOS Oscillators with Switched Tuning," IEEE Custom Integrated Circuits Conference, May 1998, IEEE.
Wilson, William B. et al., "A CMOS Self-Calibrating Frequency Synthesizer," IEEE Journal of Solid-State Circuits, Oct. 2000, pp. 1437-1444, vol. 35, No. 10, IEEE.

* cited by examiner

*Primary Examiner*—Joseph Chang
*Assistant Examiner*—Jeffrey Shin
(74) *Attorney, Agent, or Firm*—Withrow & Terranova, P.L.L.C.

(57) ABSTRACT

The present invention relates to a calibrated phase-locked loop (PLL), which has a calibration mode for measuring a tuning gain of a variable frequency oscillator (VFO) and a PLL mode for normal operation. Calibration information based on the tuning gain is used during the PLL mode to regulate a PLL loop gain. During the calibration mode, the calibrated PLL operates as a frequency-locked loop (FLL) for low frequency lock times, and during the PLL mode the calibrated PLL operates as a PLL for high frequency accuracy and low noise. By regulating the PLL loop gain, the desired noise spectrum and dynamic behavior of the PLL may be maintained in spite of variations in the operating characteristics or in the characteristics of the PLL components.

25 Claims, 13 Drawing Sheets

FREQUENCY-LOCKED LOOP CALIBRATION OF A PHASE-LOCKED LOOP GAIN

This application claims the benefit of provisional patent application Ser. No. 61/015,751, filed Dec. 21, 2007, the disclosure of which is hereby incorporated herein by reference in its entirety.

FIELD OF THE INVENTION

Embodiments of the present invention relate to phase-locked loops (PLLs) and frequency-locked loops (FLLs), both of which may be used in frequency synthesizers that may be used in wireless communications systems.

BACKGROUND OF THE INVENTION

Conventional frequency synthesizers generally include a phase-locked loop (PLL). A PLL is a device that generates an output frequency that is a function of a reference frequency. When implemented in a device such as a wireless transceiver, the output frequency of the PLL may change frequently. For example, the output frequency of the PLL changes at start-up and when changing channels. In each of these situations, it is desirable for the PLL to settle as quickly as possible on a desired output frequency. Further, in frequency hopping spread spectrum (FHSS) transceivers and in frequency division duplexing (FDD) transceivers, the output frequency of the PLL may change for each frequency hop or each transmission or reception burst. Thus, the PLL is required to have an even faster settling time in order to comply with the timing requirements of an FHSS or FDD transceiver. It is also desirable in many communication systems to accurately control the loop gain and loop bandwidth of the PLL so as to maximize tradeoffs between settling time and spectral noise or to accurately control the dynamic behavior of the PLL to match desired or predetermined characteristics of a communication signal path. The sensitivity or tuning gain of a controllable oscillator may vary with operating or environmental conditions or variations in the manufacturing process. Variations in the tuning gain may cause the loop gain of the PLL to vary, leading to undesirable variation in the noise spectrum and dynamic behavior of the PLL.

A controllable oscillator in the PLL system may use a tunable element with discrete steps, such as a selectable capacitor bank, for coarse tuning, and may use a continuously tunable element, such as one or more varactor diodes, for fine tuning. One PLL system starts with a coarse tuning mode for rapid frequency tuning before switching to a fine tuning mode for stabilization and final settling. Some frequency synthesizers in the prior art, such as those described in U.S. Pat. No. 6,724,265, provide for compensation of oscillator tuning gain by implementing a calibration technique wherein the controllable oscillator tuning voltage is measured when the controllable oscillator is phase locked to predetermined frequencies related to the desired final lock frequency. The time required for tuning gain compensation may comprise a significant portion of the total time allowed for the PLL to settle to the final desired lock frequency, increasing the duty cycle and power consumption of the PLL or in some cases preventing the PLL from meeting the required settle time of some communication systems. In addition, the prior art calibration techniques may require additional circuitry adding complexity and cost to the PLL. Thus, there is a need for a fast tuning calibration technique that requires little additional area and complexity in the PLL.

SUMMARY OF THE EMBODIMENTS

The present invention relates to a calibrated phase-locked loop (PLL), which has a calibration mode for measuring a tuning gain of a variable frequency oscillator (VFO) and a PLL mode for normal operation. Calibration information based on the tuning gain is used during the PLL mode to regulate a PLL loop gain. During the calibration mode, the calibrated PLL operates as a frequency-locked loop (FLL) for low frequency lock times, and during the PLL mode the calibrated PLL operates as a PLL for high frequency accuracy and low phase noise. By regulating the PLL loop gain, phase lock times during the PLL mode may be reduced.

In one embodiment of the present invention, the calibration mode may include a first calibration mode and a second calibration mode for measuring the tuning gain of the VFO using two operating points. The calibrated PLL may have a coarse tuning mode. During the coarse tuning mode and the calibration mode, the calibrated PLL operates as an FLL; therefore, some FLL circuit elements may be shared to reduce complexity. The calibrated PLL may have frequency reduction circuitry in a feedback loop of the calibrated PLL to reduce an output frequency of the VFO to a lower feedback frequency to implement an FLL or a PLL. The amount of frequency reduction may be reduced when operating as an FLL, when compared to the amount of frequency reduction used when operating as a PLL, to increase loop gain, which may increase loop bandwidth and reduce frequency lock times. The calibrated PLL may use the calibration information to pre-charge a PLL loop filter before entering the PLL mode to further reduce phase lock times.

In a first exemplary embodiment of the present invention, the calibrated PLL operates as an FLL during the coarse tuning mode. The calibrated PLL changes to the first calibration mode to measure a VFO response at a first operating point, followed by changing to the second calibration mode to measure the VFO response at a second operating point, which may be associated with a desired operating frequency. Next, the calibrated PLL uses the measured VFO responses to determine a tuning gain and then regulates the PLL loop gain based on the tuning gain. The calibrated PLL pre-charges the PLL loop filter as needed to operate at the desired operating frequency. Finally, the calibrated PLL changes to the PLL mode. In a second exemplary embodiment of the present invention, the calibrated PLL follows the same sequence as in the first embodiment of the present invention, except that frequencies associated with the first and second operating points bracket the desired operating frequency.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

Figure 1:
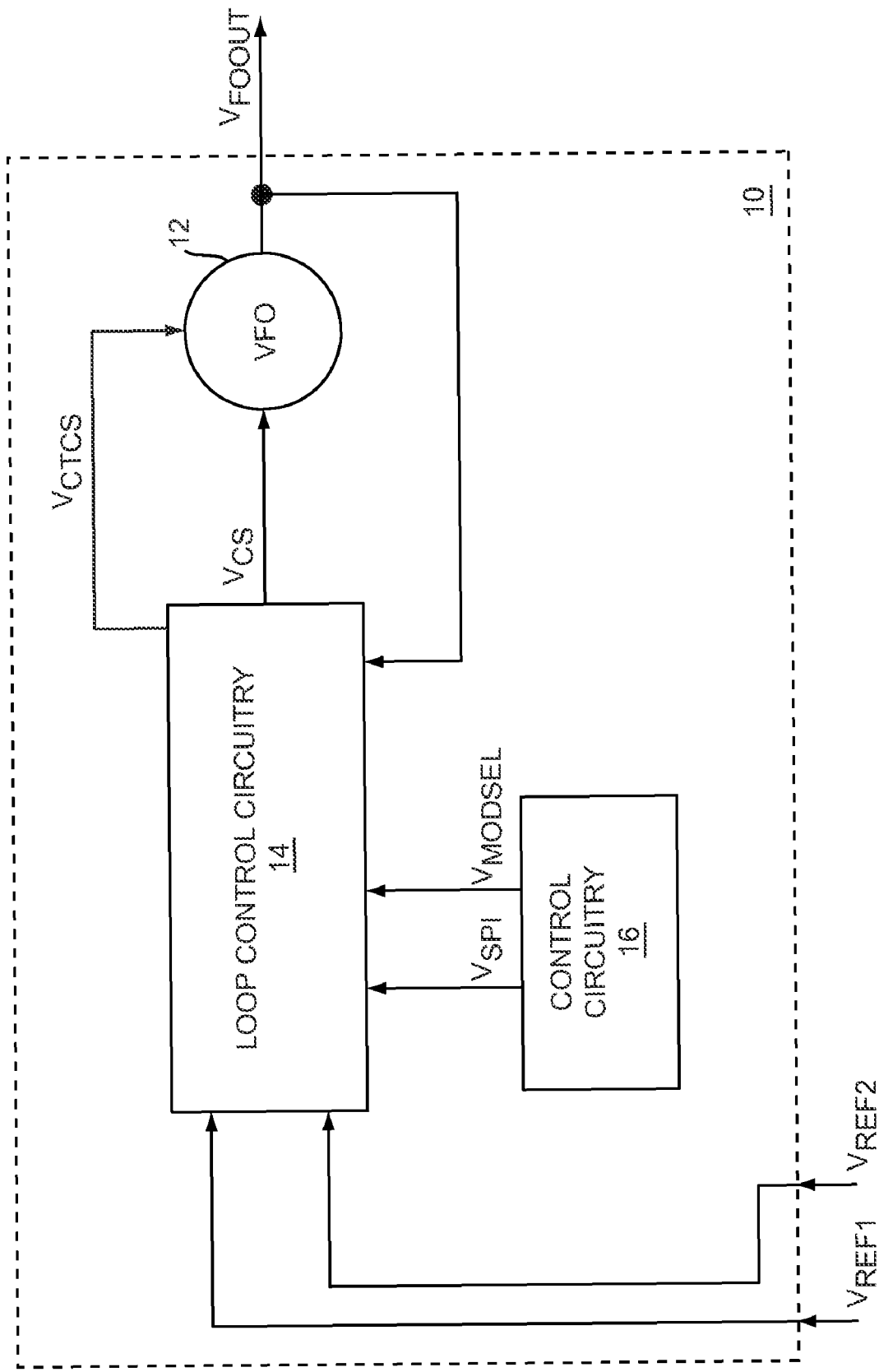
FIG. 1 shows a calibrated phase-locked loop (PLL) according to one embodiment of the present invention.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a calibrated phase-locked loop (PLL), which has a calibration mode for measuring a tuning gain of a variable frequency oscillator (VFO) and a PLL mode for normal operation. Calibration information based on the tuning gain is used during the PLL mode to regulate a PLL loop gain. During the calibration mode, the calibrated PLL operates as a frequency-locked loop (FLL) for low frequency lock times, and during the PLL mode the calibrated PLL operates as a PLL for high frequency accuracy and low noise. By regulating the PLL loop gain, phase lock times during the PLL mode may be reduced.

In one embodiment of the present invention, the calibration mode may include a first calibration mode and a second calibration mode for measuring the tuning gain of the VFO using two operating points. The calibrated PLL may have a coarse tuning mode. During the coarse tuning mode and the calibration mode, the calibrated PLL operates as an FLL; therefore, some FLL circuit elements may be shared to reduce complexity. The calibrated PLL may have frequency reduction circuitry in a feedback loop of the calibrated PLL to reduce an output frequency of the VFO to a lower feedback frequency to implement an FLL or a PLL. The amount of frequency reduction may be reduced when operating as an FLL, when compared to the amount of frequency reduction used when operating as a PLL, to increase loop gain, which may increase loop bandwidth and reduce frequency lock times. The calibrated PLL may use the calibration information to pre-charge a PLL loop filter before entering the PLL mode to further reduce phase lock times.

In a first exemplary embodiment of the present invention, the calibrated PLL operates as an FLL during the coarse tuning mode. The calibrated PLL changes to the first calibration mode to measure a VFO response at a first operating point, followed by changing to the second calibration mode to measure the VFO response at a second operating point, which may be associated with a desired operating frequency. Next, the calibrated PLL uses the measured VFO responses to determine a tuning gain and then regulates the PLL loop gain based on the tuning gain. The calibrated PLL pre-charges the PLL loop filter as needed to operate at the desired operating frequency. Finally, the calibrated PLL changes to the PLL mode. In a second exemplary embodiment of the present invention, the calibrated PLL follows the same sequence as in the first embodiment of the present invention, except that frequencies associated with the first and second operating points bracket the desired operating frequency.

FIG. 1 shows a calibrated PLL 10 according to one embodiment of the present invention. The calibrated PLL 10 includes a VFO 12, loop control circuitry 14, and control circuitry 16. The VFO 12 provides a VFO output signal $V_{FOOUT}$, which may be supplied to other circuitry (not shown) and is fed back to the loop control circuitry 14. First and second reference signals $V_{REF1}$, $V_{REF2}$ are fed to the loop control circuitry 14, which provides a control signal $V_{CS}$ and a coarse tuning control signal $V_{CTCS}$ to the VFO 12. The control circuitry 16 provides a mode select signal $V_{MODSEL}$ and a setpoint information signal $V_{SPI}$ to the loop control circuitry 14. The VFO output signal $V_{FOOUT}$ has an output frequency and an output phase, both of which are based on the control signal $V_{CS}$.

The calibrated PLL 10 has a calibration mode for measuring a tuning gain of the VFO 12 and a PLL mode for normal operation. During the calibration mode, the VFO 12 and the loop control circuitry 14 form an FLL with an FLL loop gain and an FLL loop bandwidth. During the PLL mode, the VFO 12 and the loop control circuitry 14 form a PLL with a PLL loop gain and a PLL loop bandwidth. The first reference signal $V_{REF1}$ is used to provide a frequency reference when the calibrated PLL 10 is functioning as an FLL, and the second reference signal $V_{REF2}$ is used to provide a phase reference when the calibrated PLL 10 is functioning as a PLL. When functioning as an FLL, the loop control circuitry 14 drives the control signal $V_{CS}$ to minimize a frequency difference associated with the first reference signal $V_{REF1}$ and the fed back VFO output signal $V_{FOOUT}$. When functioning as a PLL, the loop control circuitry 14 drives the control signal $V_{CS}$ to minimize a phase difference associated with the second reference signal $V_{REF2}$ and the fed back VFO output signal $V_{FOOUT}$. Each of the first and second reference signals $V_{REF1}$, $V_{REF2}$ may have any frequency or any phase. In one embodiment of the calibrated PLL 10, the first and second reference signals $V_{REF1}$, $V_{REF2}$ are based on a common reference signal.

During the calibration mode, the loop control circuitry 14 reaches a frequency lock when the output frequency of the VFO output signal $V_{FOOUT}$ is about equal to a calibration frequency setpoint. Similarly, during the PLL mode, the loop control circuitry 14 reaches a phase lock when the output frequency of the VFO output signal $V_{FOOUT}$ is about equal to a locked frequency setpoint. The tuning gain of the VFO 12 relates a magnitude of the control signal $V_{CS}$ to a corresponding output frequency of the VFO output signal $V_{FOOUT}$. Calibration information based on the tuning gain measured during the calibration mode is used during the PLL mode to regulate the PLL loop gain. Circuitry that provides the control signal $V_{CS}$ may have a control value that corresponds to the magnitude of the control signal $V_{CS}$ and the corresponding output frequency of the VFO output signal $V_{FOOUT}$. The calibration information may include the control value and the calibration frequency setpoint. In one embodiment of the present invention, the loop control circuitry 14 operates to keep the PLL loop gain about constant as the output frequency of the VFO output signal $V_{FOOUT}$ changes.

The control circuitry 16 selects the appropriate mode based on timers with programmable duration. The control circuitry 16 provides appropriate setpoint information to the loop control circuitry 14 using the setpoint information signal $V_{SPI}$ based on the selected mode, which is provided to the loop control circuitry 14 using the mode select signal $V_{MODSEL}$.

In a first exemplary embodiment of the calibrated PLL 10, the control circuitry 16 selects a first calibration mode or a PLL mode. During the first calibration mode, the VFO output signal $V_{FOOUT}$ has a first calibration frequency and the loop control circuitry 14 regulates the first calibration frequency based on a first calibration frequency setpoint, which is associated with a first control value. The loop control circuitry 14 uses the first control value, the first calibration frequency setpoint, and the coarse tuning result to estimate the tuning gain of the VFO 12. Calibration information is based on the estimated tuning gain. During the first calibration mode, the loop control circuitry 14 is functioning as an FLL; therefore, the loop control circuitry 14 may drive the control signal $V_{CS}$ to minimize the frequency difference associated with the first reference signal $V_{REF1}$ and the fed back VFO output signal $V_{FOOUT}$. During the PLL mode, the VFO output signal $V_{FOOUT}$ has a locked frequency and the loop control circuitry 14 regulates the locked frequency based on a locked frequency setpoint. During the PLL mode, the loop control circuitry 14 is functioning as a PLL; therefore, the loop control circuitry 14 may drive the control signal $V_{CS}$ to minimize the phase difference associated with the second reference signal $V_{REF2}$ and the fed back VFO output signal $V_{FOOUT}$.

In a second exemplary embodiment of the calibrated PLL 10, the control circuitry 16 selects the first calibration mode, a second calibration mode, or the PLL mode. During the first calibration mode, the VFO output signal $V_{FOOUT}$ has the first calibration frequency and the loop control circuitry 14 regulates the first calibration frequency based on the first calibration frequency setpoint, which is associated with the first control value. During the second calibration mode, the VFO output signal $V_{FOOUT}$ has a second calibration frequency and the loop control circuitry 14 regulates the second calibration frequency based on a second calibration frequency setpoint equal to the final PLL lock frequency, which is associated with a second control value. The loop control circuitry 14 uses the first control value, the first calibration frequency setpoint, the second control value, and the second calibration frequency setpoint to estimate the tuning gain of the VFO 12. Calibration information is based on the estimated tuning gain. During the PLL mode, the VFO output signal $V_{FOOUT}$ has the locked frequency and the loop control circuitry 14 regulates the locked frequency based on the locked frequency setpoint.

In a third exemplary embodiment of the calibrated PLL 10, the control circuitry 16 selects the first calibration mode, the second calibration mode, or the PLL mode. During the first calibration mode, the VFO output signal $V_{FOOUT}$ has the first calibration frequency and the loop control circuitry 14 regulates the first calibration frequency based on the first calibration frequency setpoint, which is associated with the first control value. During the second calibration mode, the VFO output signal $V_{FOOUT}$ has a second calibration frequency and the loop control circuitry 14 regulates the second calibration frequency based on a second calibration frequency setpoint, which is associated with a second control value. The loop control circuitry 14 uses the first control value, the first calibration frequency setpoint, the second control value, and the second calibration frequency setpoint to estimate the tuning gain of the VFO 12. Calibration information is based on the estimated tuning gain. During both calibration modes, the loop control circuitry 14 is functioning as an FLL; therefore, the loop control circuitry 14 may drive the control signal $V_{CS}$ to minimize the frequency difference associated with the first reference signal $V_{REF1}$ and the fed back VFO output signal $V_{FOOUT}$. During the PLL mode, the VFO output signal $V_{FOOUT}$ has the locked frequency and the loop control circuitry 14 regulates the locked frequency based on the locked frequency setpoint. The second calibration frequency may be greater than the desired operating frequency and the first calibration frequency may be less than the desired operating frequency.

In a fourth exemplary embodiment of the calibrated PLL 10, the control circuitry 16 selects a coarse tuning mode, the first calibration mode, the second calibration mode, or the PLL mode. During the coarse tuning mode, the VFO output signal $V_{FOOUT}$ has a coarse tuning frequency and the loop control circuitry 14 regulates the coarse tuning frequency based on a coarse tuning frequency setpoint. During the coarse tuning mode, the loop control circuitry 14 functions as an FLL; therefore, the loop control circuitry 14 may drive the coarse tuning control signal $V_{CTCS}$ to minimize the frequency difference associated with the first reference signal $V_{REF1}$ and the fed back VFO output signal $V_{FOOUT}$. During the first calibration mode, the VFO output signal $V_{FOOUT}$ has the first calibration frequency and the loop control circuitry 14 regulates the first calibration frequency based on the first calibration frequency setpoint, which is associated with the first control value. During the second calibration mode, the VFO output signal $V_{FOOUT}$ has the second calibration frequency and the loop control circuitry 14 regulates the second calibration frequency based on the second calibration frequency setpoint, which is associated with the second control value. The loop control circuitry 14 uses the first control value, the first calibration frequency setpoint, the second control value, and the second calibration frequency setpoint to estimate the tuning gain of the VFO 12. Calibration information is based on the estimated tuning gain. During the PLL mode, the VFO output signal $V_{FOOUT}$ has the locked frequency and the loop control circuitry 14 regulates the locked frequency based on the locked frequency setpoint.

In a fifth exemplary embodiment of the calibrated PLL 10, the control circuitry 16 selects the coarse tuning mode, the first calibration mode, or the PLL mode. During the coarse tuning mode, the VFO output signal $V_{FOOUT}$ has a coarse tuning frequency and the loop control circuitry 14 regulates the coarse tuning frequency based on a coarse tuning frequency setpoint. During the first calibration mode, the VFO output signal $V_{FOOUT}$ has the first calibration frequency and the loop control circuitry 14 regulates the first calibration frequency based on the first calibration frequency setpoint, which is associated with the first control value. The loop control circuitry 14 uses the first control value and the first calibration frequency setpoint to estimate the tuning gain of the VFO 12. Calibration information is based on the estimated tuning gain. During the PLL mode, the VFO output signal $V_{FOOUT}$ has the locked frequency and the loop control circuitry 14 regulates the locked frequency based on the locked frequency setpoint.

Alternate embodiments of the calibrated PLL 10 may have any number of coarse tuning modes, calibration modes, PLL modes, or the like. For example, an alternate or additional coarse tuning mode may function as an FLL to regulate first control value to provide rapid settle time to adjust the frequency of the VFO output signal close to the locked frequency prior to the PLL mode. The calibrated PLL 10 may be used to form a frequency synthesizer in a wireless communications system. A transmit signal, a receive signal, or both may be based on one or more signals provided by the frequency synthesizer.

Figure 2:
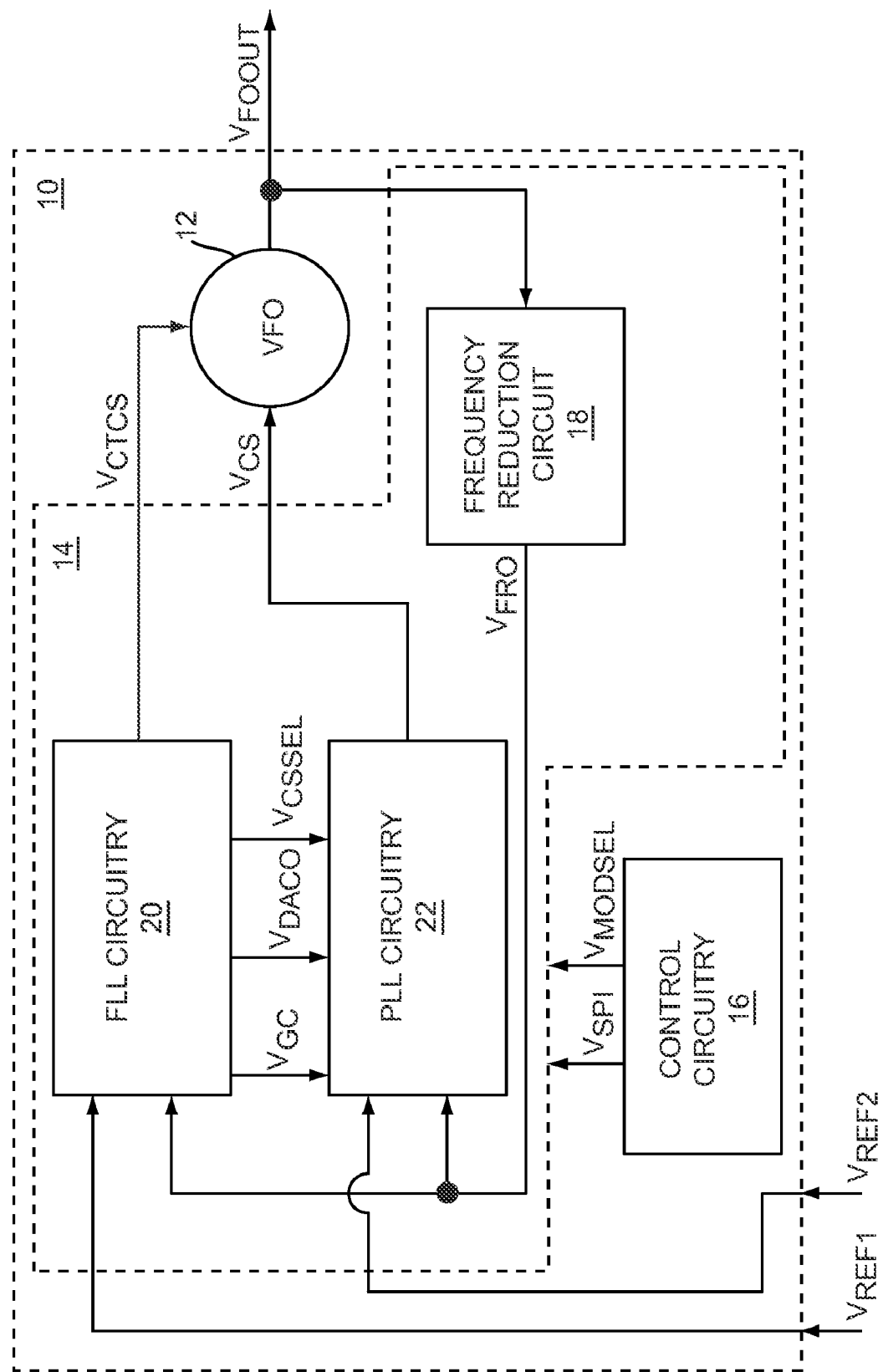
FIG. 2 shows details of loop control circuitry illustrated in FIG. 1 according to one embodiment of the loop control circuitry.

FIG. 2 shows details of the loop control circuitry 14 illustrated in FIG. 1 according to one embodiment of the loop control circuitry 14. The loop control circuitry 14 includes a frequency reduction circuit 18, FLL circuitry 20, and PLL circuitry 22. The first reference signal $V_{REF1}$ is fed to the FLL circuitry 20 and the second reference signal $V_{REF2}$ is fed to the PLL circuitry 22. The FLL circuitry 20 provides a control signal select signal $V_{CSSEL}$, a digital-to-analog converter (DAC) output signal $V_{DACO}$, and a gain control signal $V_{GC}$ to the PLL circuitry 22. The VFO output signal $V_{FOOUT}$ is fed back to the frequency reduction circuit 18, which provides a frequency reduced output signal $V_{FRO}$ to the FLL circuitry 20 and the PLL circuitry 22 based on applying a frequency reduction to the VFO output signal $V_{FOOUT}$.

The frequency reduction circuit 18 is in the feedback loop of the calibrated PLL 10 to reduce the output frequency of the VFO output signal $V_{FOOUT}$ to a lower feedback frequency when operating as an FLL or a PLL. The amount of frequency reduction may be reduced when operating as an FLL when compared to the amount of frequency reduction used when operating as a PLL to increase loop gain, which may increase loop bandwidth and reduce frequency lock times. An FLL and a PLL drive a controlled oscillator to a desired frequency; however, in an FLL, control of the oscillator is based on detecting frequency error rather then detecting phase error, as in a PLL. An FLL tends to be inherently noisy, which may make the FLL unsuitable for steady-state operation. However, an FLL has certain advantages over a PLL. An FLL with a single integrator is a Type 1 feedback loop, which is stable over a wide range of bandwidths. Therefore, an FLL may be operated with a wider bandwidth than a PLL, thereby providing faster frequency lock times. The bandwidth in an FLL may be based on the loop gain of the FLL, and increasing the loop gain may increase the bandwidth. If an FLL is used for gain calibration of a PLL, then calibration times may be reduced compared to other methods.

During the PLL mode, the VFO output signal $V_{FOOUT}$ has the locked frequency and the frequency reduced output signal $V_{FRO}$ has a reduced locked frequency, which may be less than the locked frequency, and a reduced frequency locked phase. A PLL division ratio is about equal to the locked frequency divided by the reduced locked frequency. The PLL division ratio may be based on the locked frequency setpoint. During the PLL mode, the PLL circuitry 22 is functioning as a PLL; therefore, the control signal select signal $V_{CSSEL}$ may be configured by the FLL circuitry 20 to cause the PLL circuitry 22 to drive the control signal $V_{CS}$ to minimize a phase difference between a reference phase of the second reference signal $V_{REF2}$ and the reduced frequency locked phase.

During the first calibration mode, the VFO output signal $V_{FOOUT}$ has the first calibration frequency and the frequency reduced output signal $V_{FRO}$ has a reduced first calibration frequency, which may be less than the first calibration frequency. A first calibration division ratio is equal to the first calibration frequency divided by the reduced first calibration frequency. The first calibration division ratio may be based on the first calibration frequency setpoint. During the first calibration mode, the FLL circuitry 20 is functioning as an FLL; therefore, the control signal select signal $V_{CSSEL}$ may be configured by the FLL circuitry 20 to cause the PLL circuitry 22 to drive the control signal $V_{CS}$ based on the DAC output signal $V_{DACO}$ to minimize a frequency difference between a reference frequency of the first reference signal $V_{REF1}$ and the reduced first calibration frequency.

During the second calibration mode, the VFO output signal $V_{FOOUT}$ has the second calibration frequency and the frequency reduced output signal $V_{FRO}$ has a reduced second calibration frequency, which may be less than the second calibration frequency. A second calibration division ratio is equal to the second calibration frequency divided by the reduced second calibration frequency. The second calibration division ratio may be based on the second calibration frequency setpoint. During the second calibration mode, the FLL circuitry 20 is functioning as an FLL; therefore, the control signal select signal $V_{CSSEL}$ may be configured by the FLL circuitry 20 to cause the PLL circuitry 22 to drive the control signal $V_{CS}$ based on the DAC output signal $V_{DACO}$ to minimize a frequency difference between the reference frequency of the first reference signal $V_{REF1}$ and the reduced second calibration frequency.

When functioning as a PLL, the calibrated PLL 10 has a PLL bandwidth. When functioning as an FLL, the calibrated PLL 10 has an FLL bandwidth. In one embodiment of the calibrated PLL 10, the FLL bandwidth is greater than the PLL bandwidth. A first PLL-to-calibration ratio is about equal to the PLL division ratio divided by the first calibration division ratio. A second PLL-to-calibration ratio is about equal to the PLL division ratio divided by the second calibration division ratio. In a first exemplary embodiment of the frequency reduction circuit 18, the first PLL-to-calibration ratio is greater than about one. In a second exemplary embodiment of the frequency reduction circuit 18, the second PLL-to-calibration ratio is greater than about one. In a third exemplary embodiment of the frequency reduction circuit 18, the first PLL-to-calibration ratio is equal to about two. In a fourth exemplary embodiment of the frequency reduction circuit 18, the second PLL-to-calibration ratio is equal to about two. In a fifth exemplary embodiment of the frequency reduction circuit 18, the first PLL-to-calibration ratio is equal to about four. In a sixth exemplary embodiment of the frequency reduction circuit 18, the second PLL-to-calibration ratio is equal to about four. In a seventh exemplary embodiment of the frequency reduction circuit 18, the first PLL-to-calibration ratio is equal to about eight. In an eighth exemplary embodiment of the frequency reduction circuit 18, the second PLL-to-calibration ratio is equal to about eight. In a ninth exemplary embodiment of the frequency reduction circuit 18, the first PLL-to-calibration ratio is equal to about a power of two. In a tenth exemplary embodiment of the frequency reduction circuit 18, the second PLL-to-calibration ratio is equal to about a power of two.

Figure 3:
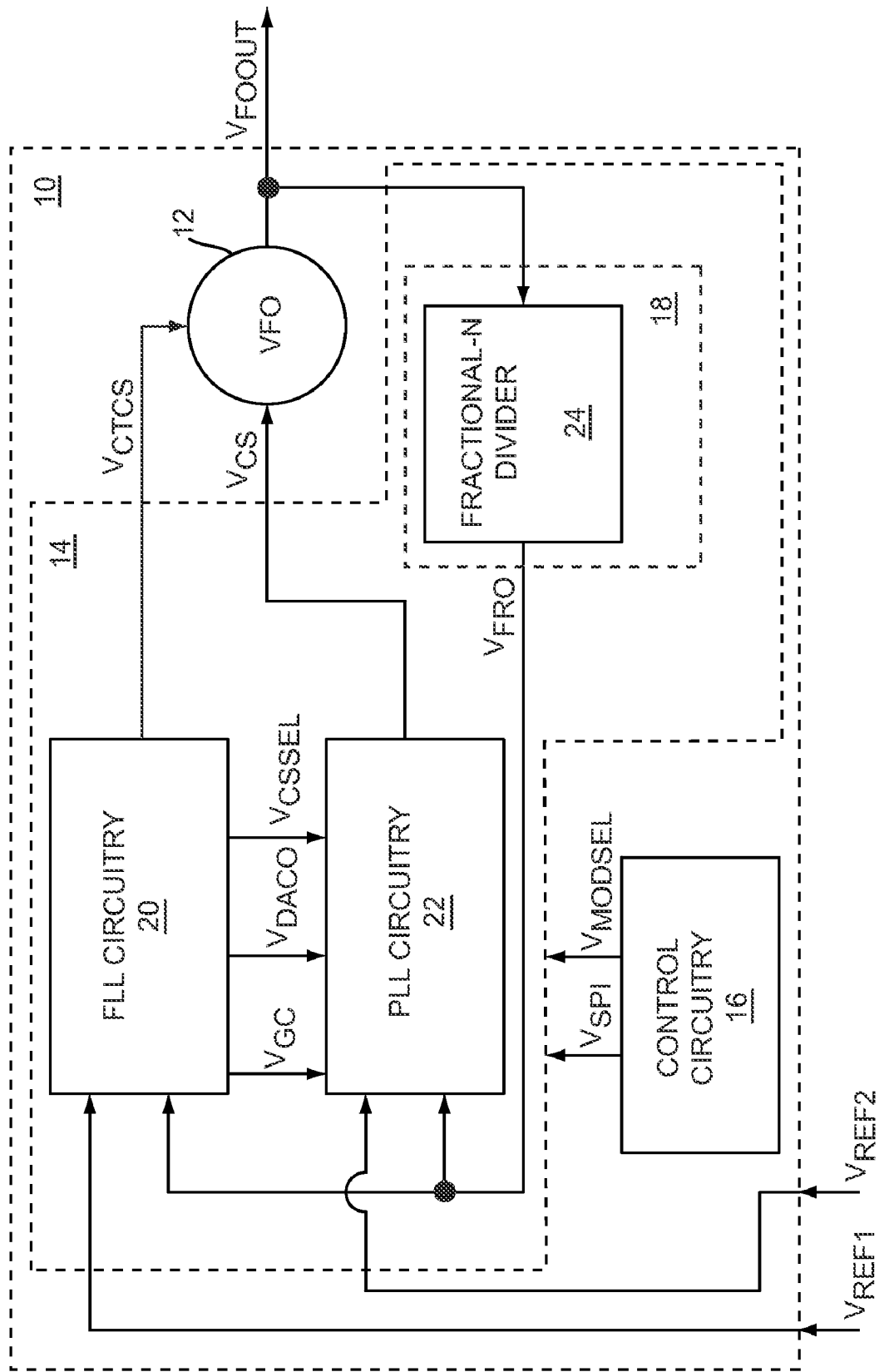
FIG. 3 shows details of a frequency reduction circuit illustrated in FIG. 2 according to one embodiment of the frequency reduction circuit.

FIG. 3 shows details of the frequency reduction circuit 18 illustrated in FIG. 2 according to one embodiment of the frequency reduction circuit 18. The frequency reduction circuit 18 includes a fractional-N divider 24, which receives the VFO output signal $V_{FOOUT}$ and provides the frequency reduced output signal $V_{FRO}$ to the FLL circuitry 20 and the PLL circuitry 22 based on applying the frequency reduction to the VFO output signal $V_{FOOUT}$. The fractional-N divider 24 is in the feedback loop of the calibrated PLL 10 to reduce the output frequency of the VFO output signal $V_{FOOUT}$ to a lower feedback frequency when operating as an FLL or a PLL. The amount of frequency reduction may be based on any or all of the first calibration frequency setpoint, the second calibration frequency setpoint, the locked frequency setpoint, or the coarse tuning frequency setpoint. A ratio of the output frequency of the VFO output signal $V_{FOOUT}$ divided by a frequency of the frequency reduced output signal $V_{FRO}$ may be about equal to an integer or may be about equal to a fractional number.

Figure 4:
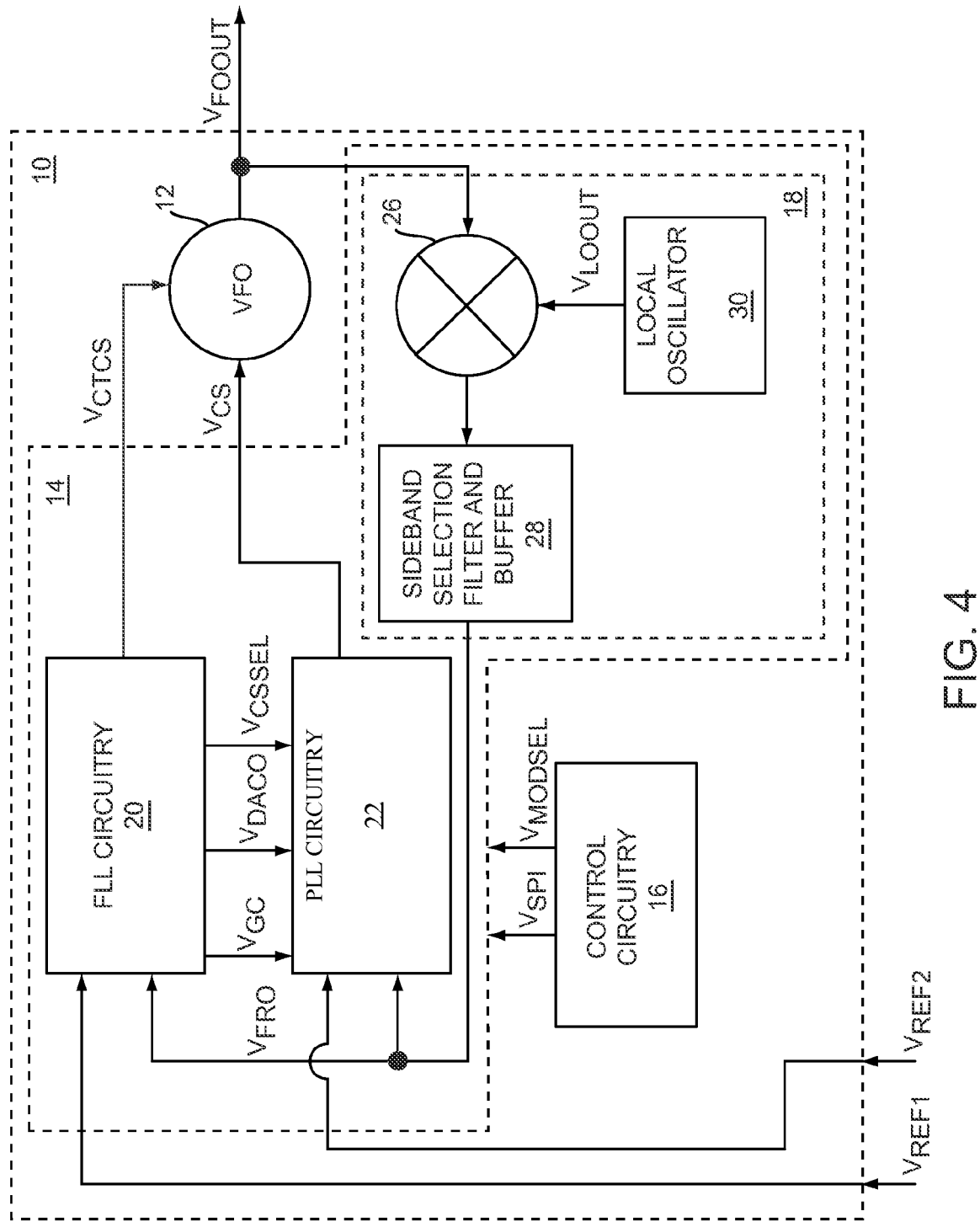
FIG. 4 shows details of the frequency reduction circuit illustrated in FIG. 2 according to an alternate embodiment of the frequency reduction circuit.

FIG. 4 shows details of the frequency reduction circuit 18 illustrated in FIG. 2 according to an alternate embodiment of the frequency reduction circuit 18. The frequency reduction circuit 18 includes a mixer 26, a sideband selection filter and buffer 28, and a local oscillator (LO) 30. The LO 30 provides an LO output signal $V_{LOOUT}$ to the mixer 26, which receives and mixes the VFO output signal $V_{FOOUT}$ with the LO output signal $V_{LOOUT}$ to provide an intermediate frequency (IF) signal (not shown) to the sideband selection filter and buffer 28. The sideband selection filter and buffer 28 provides the frequency reduced output signal $V_{FRO}$ to the FLL circuitry 20 and the PLL circuitry 22.

An additional benefit of the present invention is that it allows known spurious tones (or "spurs") to be systematically avoided or eliminated with a method similar to that disclosed by Scott R. Humphreys et al. in U.S. Pat. No. 7,098,754. In any RF system spurs may occur at a frequency $f_{spur}$ given by:

$$f_{spur} = (m \cdot f_1 + n \cdot f_2),$$

where f1 and f2 are fundamental signal frequencies such as a reference frequency of the system, a frequency of an oscillator within the system, or other external interfering sources, and m and n are positive or negative integers. These spurs become problematic if they occur close to a frequency of a signal used in a communication system such that transmit spectral mask requirements or receive blocking spectral requirements are not met. One type of problematic spur may occur at the VFO output signal $V_{FOOUT}$ when the frequency of the VFO 12 is close to an integer multiple (or harmonic) of the reduced frequency output signal $V_{FRO}$. This type of spur may be avoided by selecting the IF frequency to be equal to an integer division of the frequency of the VFO output signal $V_{FOOUT}$. Generally, there is more than one IF frequency that satisfies this condition. A second type of problematic spur may occur when the frequency of the LO 30 is close to a harmonic of a reference signal, such as the first or second reference signal $V_{REF1}$, $V_{REF2}$. This spur may be translated by the RF mixer 26 to the reduced frequency output signal $V_{FRO}$, and may subsequently affect the control signal $V_{CS}$, such that the spur may appear in the VFO output signal $V_{FOOUT}$. This second type of spur may be avoided by selecting the IF frequency that provides the maximum distance between the frequency of the LO 30 and the closest harmonic first or second reference signal $V_{REF1}$, $V_{REF2}$ to the frequency of the LO 30.

The IF signal has two sideband components as a result of the mixing of the VFO output signal $V_{FOOUT}$ and the LO output signal $V_{LOOUT}$. A frequency of one of the sideband components, called an upper sideband component, is equal to the sum of the frequencies of the VFO output signal $V_{FOOUT}$ and the LO output signal $V_{LOOUT}$. A frequency of the other of the sideband components, called a lower sideband component, is equal to the difference of the frequencies of the VFO output signal $V_{FOOUT}$ and the LO output signal $V_{LOOUT}$. The sideband selection filter and buffer 28 removes the upper sideband component and provides a filtered frequency reduced output signal $V_{FRO}$ based on buffering the lower sideband component.

The mixer 26 and the sideband selection filter and buffer 28 are in the feedback loop of the calibrated PLL 10 to reduce the output frequency of the VFO output signal $V_{FOOUT}$ to a lower feedback frequency when operating as an FLL or a PLL. The amount of frequency reduction may be based on any or all of the first calibration frequency setpoint, the second calibration frequency setpoint, the locked frequency setpoint, or the coarse tuning frequency setpoint. A ratio of the output frequency of the VFO output signal $V_{FOOUT}$ divided by a frequency of the frequency reduced output signal $V_{FRO}$ may be about equal to an integer or may be about equal to a fractional number.

Figure 5:
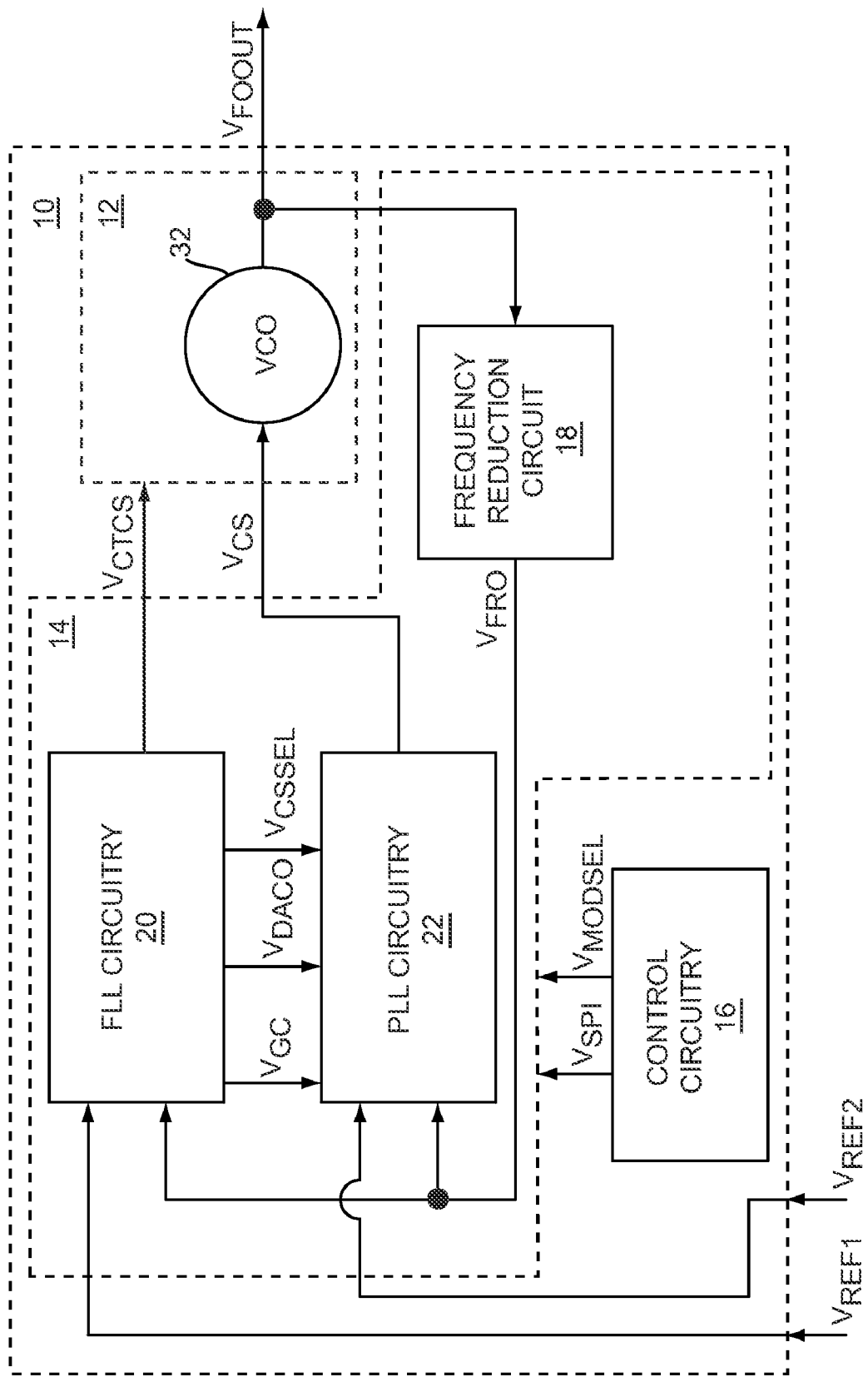
FIG. 5 shows details of a variable frequency oscillator (VFO) illustrated in FIG. 2 according to one embodiment of the VFO.

FIG. 5 shows details of the VFO 12 illustrated in FIG. 2 according to one embodiment of the VFO 12. The VFO 12 includes a voltage controlled oscillator (VCO) 32, which receives the control signal $V_{CS}$ and provides the VFO output signal $V_{FOOUT}$ based on the control signal $V_{CS}$. The VCO 32 may respond to a voltage of the control signal $V_{CS}$.

Figure 6:
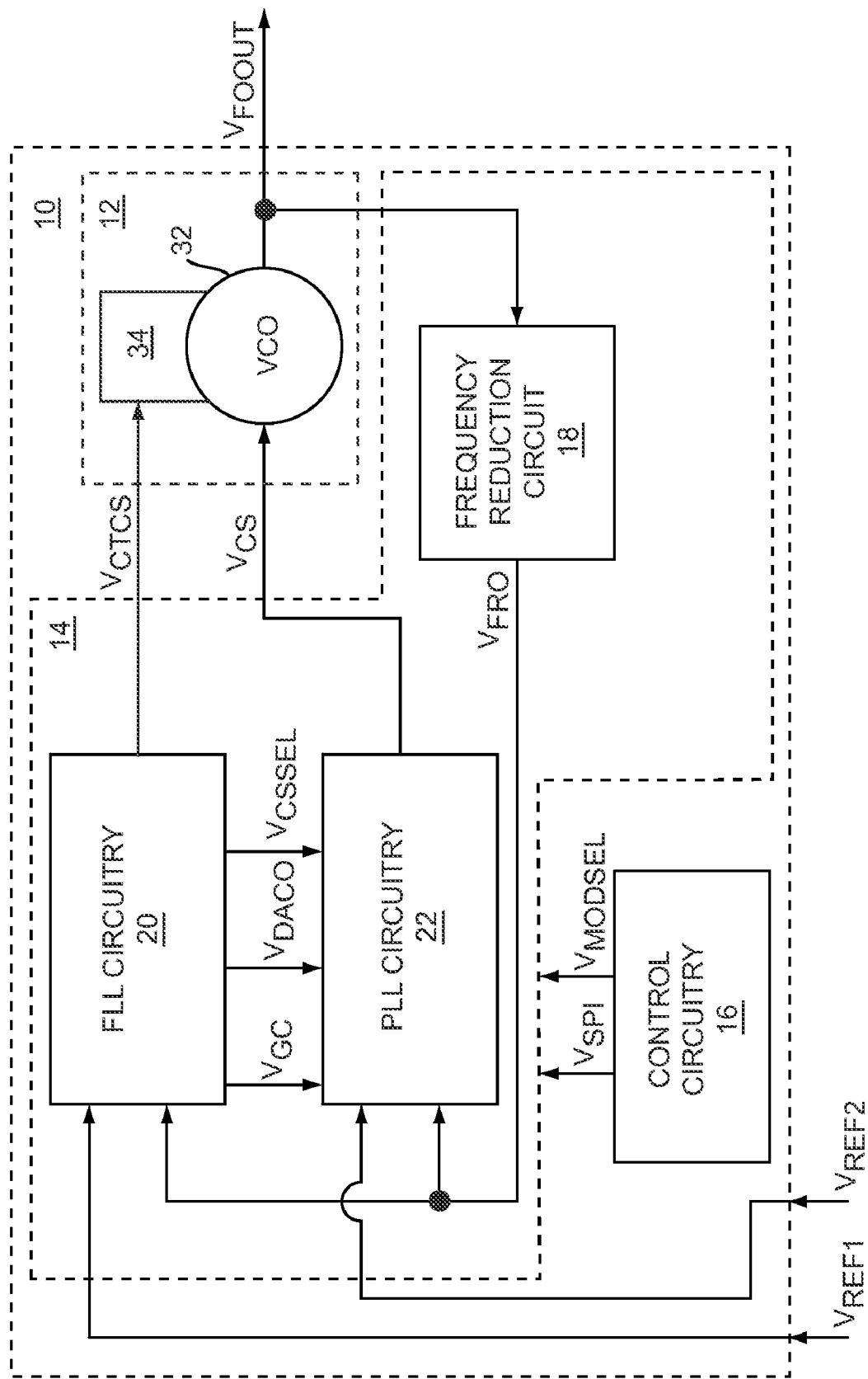
FIG. 6 shows details of the VFO illustrated in FIG. 2 according to an alternate embodiment of the VFO.

FIG. 6 shows details of the VFO 12 illustrated in FIG. 2 according to an alternate embodiment of the VFO 12. The VFO 12 includes the VCO 32, which includes discrete tuning elements circuitry 34. The FLL circuitry 20 provides the coarse tuning control signal $V_{CTCS}$ to the discrete tuning elements circuitry 34, which selects one or more discrete tuning elements based on the coarse tuning control signal $V_{CTCS}$. The VCO 32 receives the control signal $V_{CS}$ and provides the VFO output signal $V_{FOOUT}$ based on the control signal $V_{CS}$ and the selection of discrete tuning elements. The output frequency of the VFO output signal $V_{FOOUT}$ may be based on resonant elements in the VCO 32, such as the selected discrete tuning elements and voltage controlled resonant elements, which may include one or more varactor diode. Therefore, the frequency of the VFO output signal $V_{FOOUT}$ may be based on both the coarse tuning control signal $V_{CTCS}$ and the control signal $V_{CS}$.

During the coarse tuning mode, the VFO output signal $V_{FOOUT}$ has the coarse tuning frequency and the frequency reduced output signal $V_{FRO}$ has a reduced coarse tuning frequency, which may be less than the coarse tuning frequency. An FLL division ratio is about equal to the coarse tuning frequency divided by the reduced coarse tuning frequency. The FLL division ratio may be based on the coarse tuning frequency setpoint. During the coarse tuning mode, the FLL circuitry 20 is functioning as an FLL; therefore, the FLL circuitry 20 may drive the coarse tuning control signal $V_{CTCS}$ to minimize a frequency difference between a reference frequency of the first reference signal $V_{REF1}$ and the reduced coarse tuning frequency.

Figure 7:
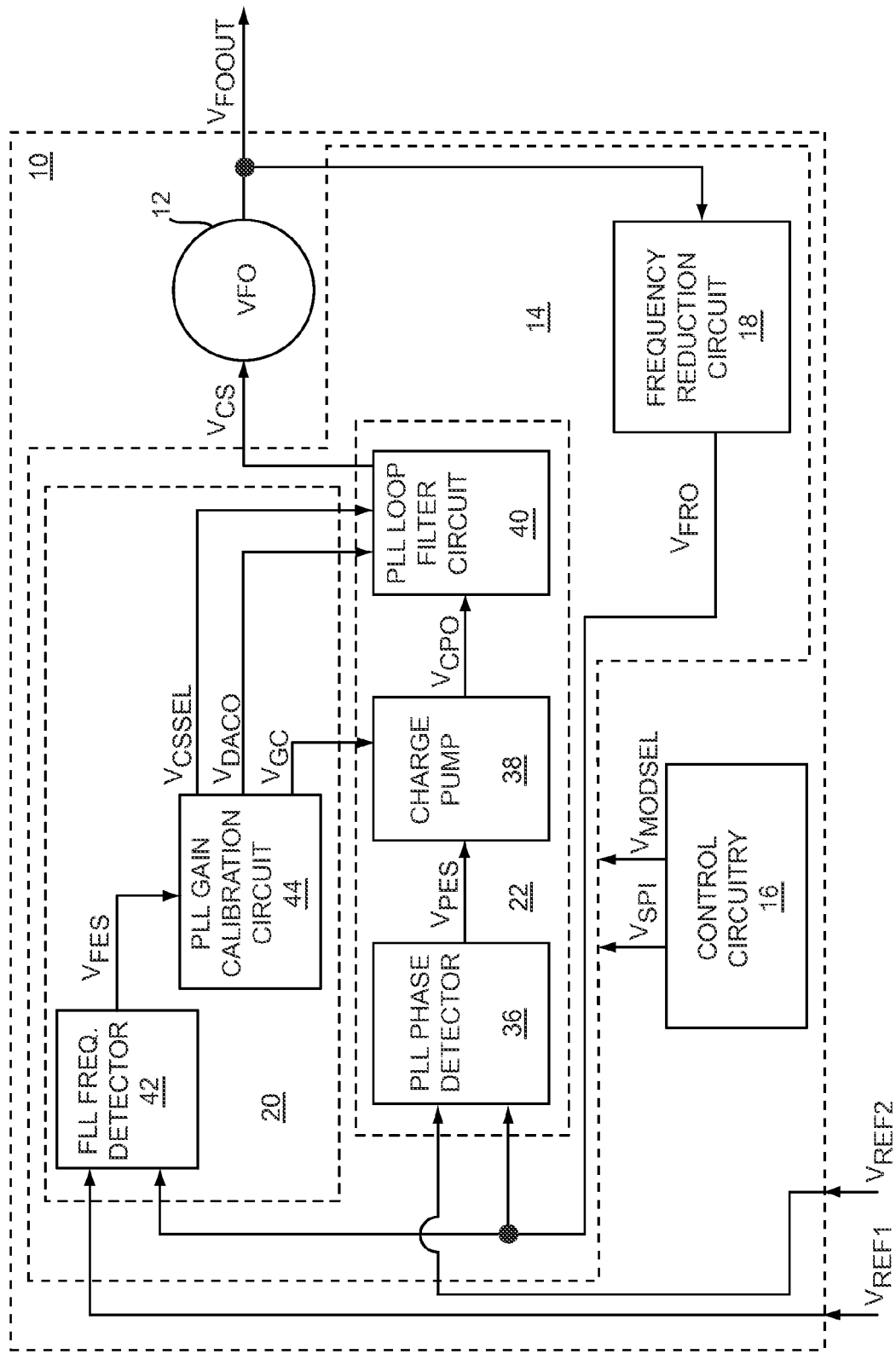
FIG. 7 shows details of frequency-locked loop (FLL) circuitry and PLL circuitry illustrated in FIG. 2 according to one embodiment of the FLL circuitry and one embodiment of the PLL circuitry, respectively.

FIG. 7 shows details of the FLL circuitry 20 and the PLL circuitry 22 illustrated in FIG. 2 according to one embodiment of the FLL circuitry 20 and one embodiment of the PLL circuitry 22, respectively. The PLL circuitry 22 includes a PLL phase detector 36, a charge pump 38, and a PLL loop filter circuit 40. The FLL circuitry 20 includes an FLL frequency detector 42 and a PLL gain calibration circuit 44. The FLL frequency detector 42 receives the first reference signal $V_{REF1}$ and the frequency reduced output signal $V_{FRO}$. During the first calibration mode or the second calibration mode, the FLL frequency detector 42 provides a frequency error signal $V_{FES}$ based on a frequency difference between the first reference signal $V_{REF1}$ and the frequency reduced output signal $V_{FRO}$. The PLL gain calibration circuit 44 receives the frequency error signal $V_{FES}$ and provides the control signal select signal $V_{CSSEL}$ and the DAC output signal $V_{DACO}$ to the PLL loop filter circuit 40. Additionally, the PLL gain calibration circuit 44 provides the gain control signal $V_{GC}$ to the charge pump 38.

During the first calibration mode, the FLL circuitry 20 is functioning as an FLL; therefore, the control signal select signal $V_{CSSEL}$ may be configured by the PLL gain calibration circuit 44 to cause the PLL loop filter circuit 40 to drive the control signal $V_{CS}$ based on the DAC output signal $V_{DACO}$ to minimize a frequency difference between the reference frequency of the first reference signal $V_{REF1}$ and the reduced first calibration frequency. The DAC output signal $V_{DACO}$ is based on the first control value. Similarly, during the second calibration mode, the FLL circuitry 20 is functioning as an FLL; therefore, the control signal select signal $V_{CSSEL}$ may be configured by the PLL gain calibration circuit 44 to cause the PLL loop filter circuit 40 to drive the control signal $V_{CS}$ based on the DAC output signal $V_{DACO}$ to minimize a frequency difference between the reference frequency of the first reference signal $V_{REF1}$ and the reduced second calibration frequency. The DAC output signal $V_{DACO}$ is based on the second control value.

The frequency reduced output signal $V_{FRO}$ is also fed to the PLL phase detector 36. Additionally, the second reference signal $V_{REF2}$ is fed to the PLL phase detector 36, which compares the frequency reduced output signal $V_{FRO}$ and the second reference signal $V_{REF2}$ to provide a phase-error signal $V_{PES}$ based on a phase difference, a frequency difference, or both between the frequency reduced output signal $V_{FRO}$ and the second reference signal $V_{REF2}$. The phase-error signal $V_{PES}$ is fed to the charge pump 38, which applies gain to the phase-error signal $V_{PES}$ to provide a charge pump output signal $V_{CPO}$. The charge pump output signal $V_{CPO}$ is fed to the PLL loop filter circuit 40, which filters the charge pump output signal $V_{CPO}$ to provide the control signal $V_{CS}$ to the VFO 12.

During the PLL mode, the PLL circuitry 22 is functioning as a PLL; therefore, the control signal select signal $V_{CSSEL}$ may be configured by the PLL gain calibration circuit 44 to cause the PLL loop filter circuit 40 to drive the control signal $V_{CS}$ to minimize a phase difference between a reference phase of the second reference signal $V_{REF2}$ and the reduced frequency locked phase based on the charge pump output signal $V_{CPO}$. The charge pump 38 may have a charge pump gain based on a charge pump current, which is based on the gain control signal $V_{GC}$. During the PLL mode, the calibrated PLL 10 may have a PLL loop gain, which may be based on a product of the tuning gain and the charge pump gain. The PLL gain calibration circuit 44 may drive the gain control signal $V_{AC}$ to set the charge pump current to maintain a constant PLL loop gain over operating conditions of the calibrated PLL 10. Before entering the PLL mode, the control signal select signal $V_{CSSEL}$ may be configured by the PLL gain calibration circuit 44 to pre-charge the PLL loop filter circuit 40 based on the DAC output signal $V_{DACO}$, such that when the PLL mode is entered, the control signal $V_{CS}$ drives the output frequency of the DAC output signal $V_{DACO}$ to a desired operating frequency.

Figure 8:
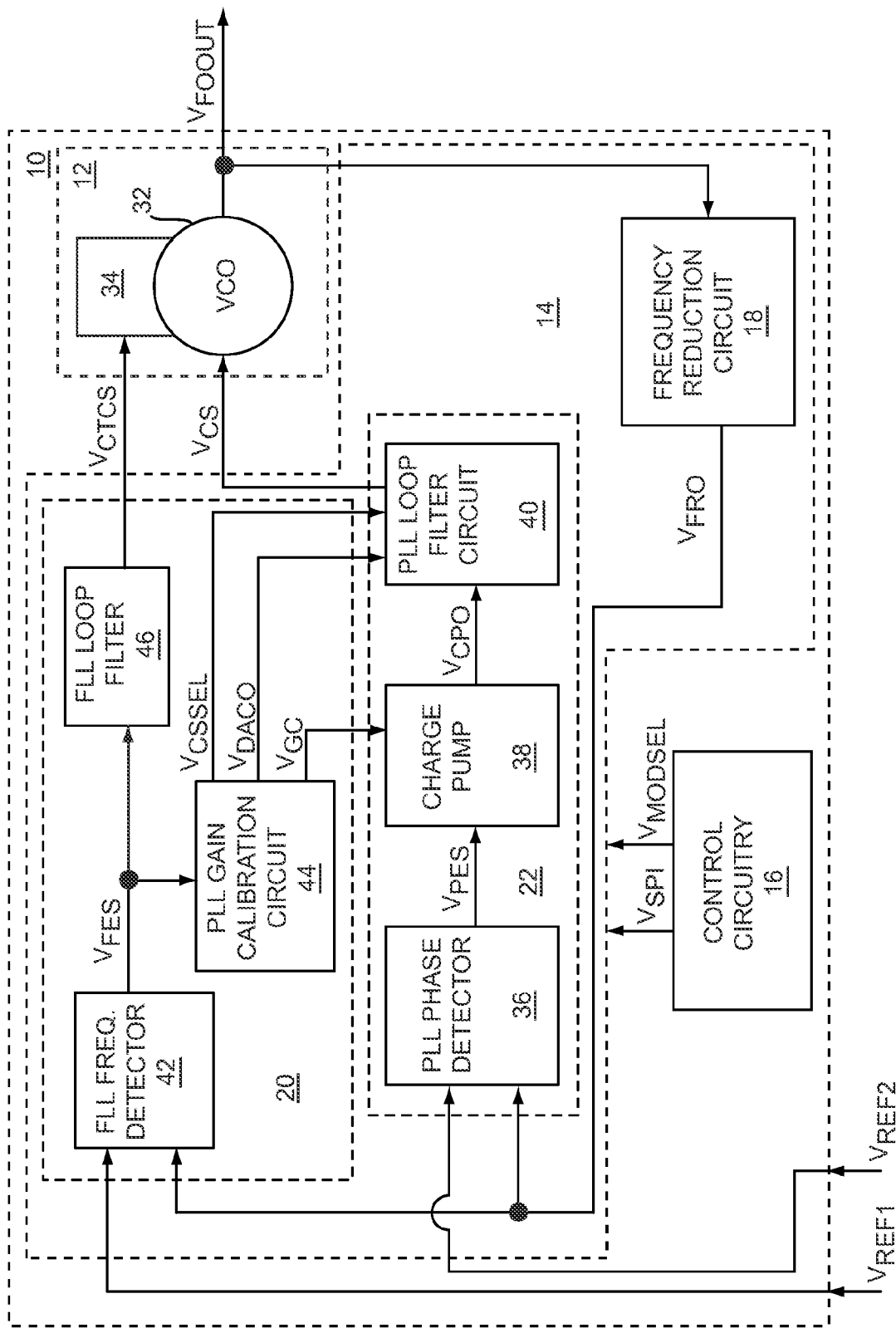
FIG. 8 shows the calibrated PLL according to an alternate embodiment of the present invention.

FIG. 8 shows the calibrated PLL 10 according to an alternate embodiment of the present invention. The VFO 12 illustrated in FIG. 8 is similar to the VFO 12 illustrated in FIG. 6. Additionally, the loop control circuitry 14 illustrated in FIG. 8 is similar to the loop control circuitry 14 illustrated in FIG. 7. The FLL circuitry 20 includes an FLL loop filter 46, which receives and filters the frequency error signal $V_{FES}$ to provide the coarse tuning control signal $V_{CTCS}$. During the coarse tuning mode, an FLL loop bandwidth may be based on the FLL loop filter 46. During any or all of the first calibration mode, the second calibration mode, or the PLL mode, the coarse tuning control signal $V_{CTCS}$ may be held about constant. In one embodiment of the present invention, the coarse tuning mode is directly followed by the first calibration mode.

Figure 9:
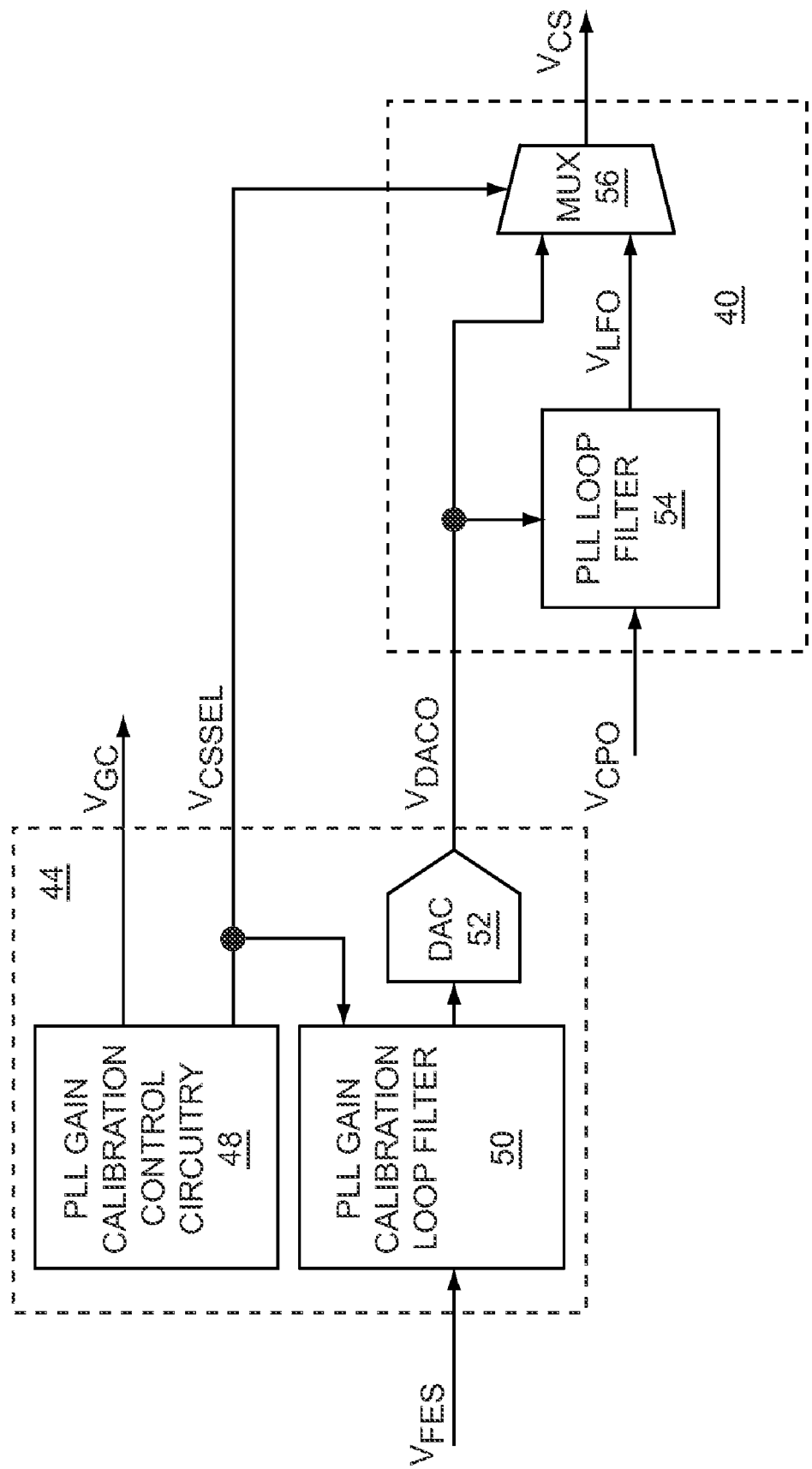
FIG. 9 shows details of a PLL gain calibration circuit and a PLL loop filter circuit illustrated in FIG. 8 according to one embodiment of the PLL gain calibration circuit and one embodiment of the PLL loop filter circuit.

FIG. 9 shows details of the PLL gain calibration circuit 44 and the PLL loop filter circuit 40 illustrated in FIG. 8 according to one embodiment of the PLL gain calibration circuit 44 and one embodiment of the PLL loop filter circuit 40. The PLL gain calibration circuit 44 includes PLL gain calibration control circuitry 48, a PLL gain calibration loop filter 50, and a DAC 52. The PLL loop filter circuit 40 includes a PLL loop filter 54 and a multiplexer 56. The PLL gain calibration control circuitry 48 provides the control signal select signal $V_{CSSEL}$ to the PLL gain calibration loop filter 50 and to a control input of the multiplexer 56. Additionally, the PLL gain calibration control circuitry 48 provides the gain control signal $V_{AC}$. The PLL gain calibration loop filter 50 receives and filters the frequency error signal $V_{FES}$ to provide a DAC input signal to the DAC 52. The DAC 52 converts the DAC input signal from a digital signal to an analog signal, and provides the DAC output signal $V_{DACO}$ to the PLL loop filter 54 and to a first data input of the multiplexer 56 based on the analog signal. The PLL loop filter 54 receives and filters the charge pump output signal $V_{CPO}$ to provide a loop filter output signal $V_{LFO}$ to a second data input of the multiplexer 56. The multiplexer 56 provides the control signal $V_{CS}$, which is based on either the DAC output signal $V_{DACO}$ or the charge pump output signal $V_{CPO}$ depending on the control signal select signal $V_{CSSEL}$. The calibrated PLL 10 may use the calibration information to pre-charge the PLL loop filter 54 before entering the PLL mode to further reduce phase lock times.

During the first calibration mode, the PLL gain calibration loop filter 50 provides the first control value to the DAC 52, which provides the DAC output signal $V_{DACO}$ based on the first control value. During the second calibration mode, the PLL gain calibration loop filter 50 provides the second control value to the DAC 52, which provides the DAC output signal $V_{DACO}$ based on the second control value. The calibration information may be based on linear interpolation using the first control value, the second control value, the first calibration frequency setpoint, and the second calibration frequency setpoint. By using the first and second control values to infer actual values of the DAC output signal $V_{DACO}$, an analog-to-digital converter (ADC) is not needed to determine the calibration information. During the first calibration mode, multiple samples of the first control value may be taken and averaged to arrive at an effective first control value. Similarly, during the second calibration mode, multiple samples of the second control value may be taken and averaged to arrive at an effective second control value. The calibration information may be based on the effective first control value, the effective second control value, or both.

Figure 10:
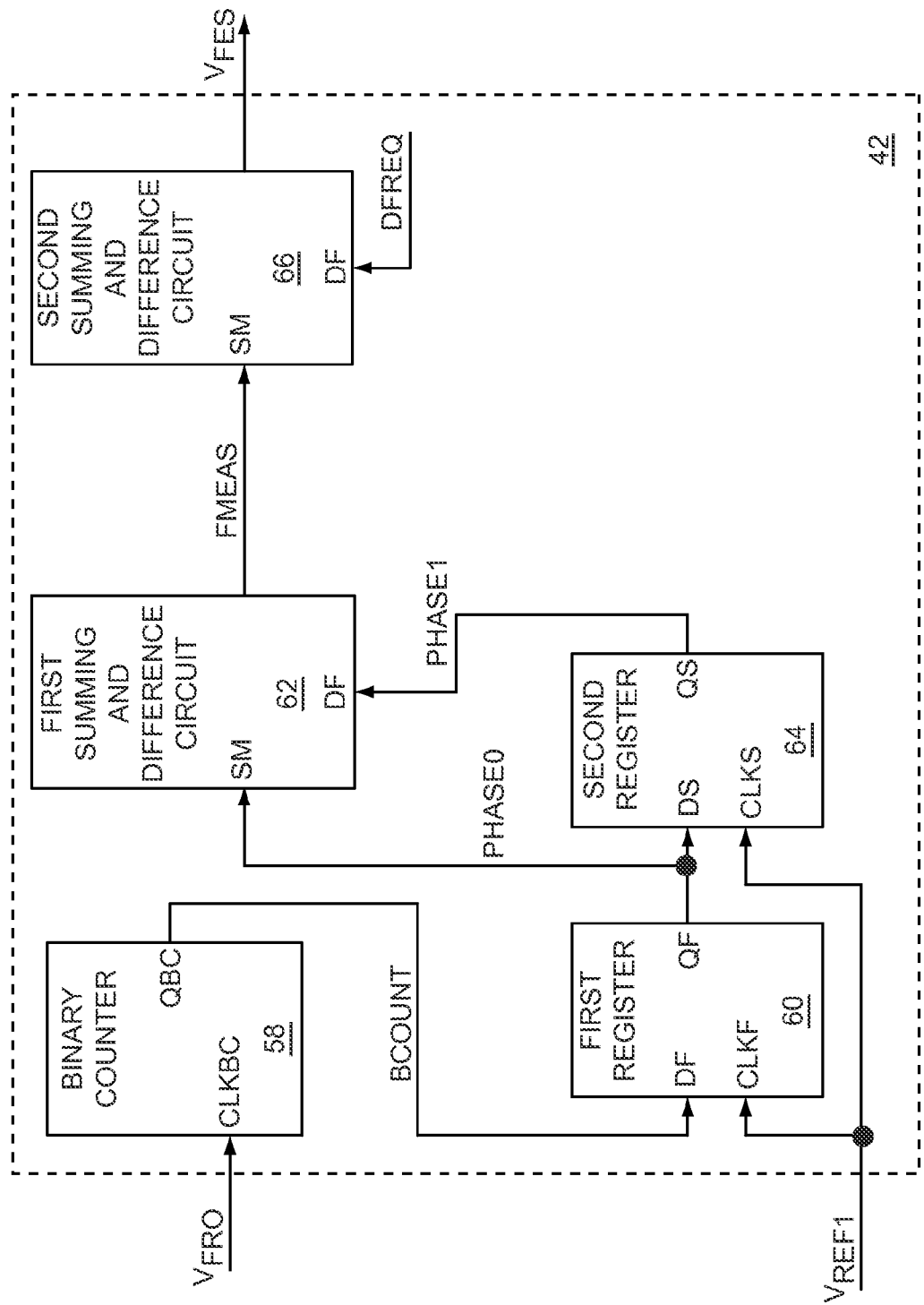
FIG. 10 shows details of an FLL frequency detector illustrated in FIG. 8 according to one embodiment of the FLL frequency detector.

FIG. 10 shows details of the FLL frequency detector 42 illustrated in FIG. 8 according to one embodiment of the FLL frequency detector 42. The FLL frequency detector 42 provides the frequency error signal $V_{FES}$ by measuring the frequency of the frequency reduced output signal $V_{FRO}$ and subtracting out a desired frequency, which is provided by a desired frequency value DFREQ. The frequency may be measured by counting the number of cycles of the frequency reduced output signal $V_{FRO}$ that occur during a specified time period, which may be at least one period of the first reference signal $V_{REF1}$. In one embodiment of the present invention, the desired frequency may be approximately equal to the frequency of the first reference signal $V_{REF1}$, such that the desired frequency value DFREQ, representing the number of cycles of the frequency reduced output signal $V_{FRO}$ that occur during one period of the first reference signal $V_{REF1}$, is approximately one. In an alternate embodiment of the FLL frequency detector 42, the frequency may be measured by counting the number of cycles of the VFO output signal $V_{FOOUT}$ that occur during a specified time period, which may be at least one period of the first reference signal $V_{REF1}$. In an additional embodiment of the present invention, the FLL frequency detector 42 provides only a fixed positive or fixed negative value for the frequency error signal $V_{FES}$ if the frequency reduced output signal $V_{FRO}$ has a shorter or longer period than the first reference signal $V_{REF1}$, respectively, thereby providing a "bang-bang" type of control algorithm for the FLL. In an exemplary embodiment of the present invention, the value of the frequency error signal $V_{FES}$ is approximately proportional to the frequency error measured by the FLL frequency detector 42 giving a better behaved proportional, proportional-integral, or proportional-integral-differential control algorithm for the FLL, depending on the implementation of the FLL loop filter 46.

The FLL frequency detector 42 includes a binary counter 58 having a binary counter clock input CLKBC, which receives the frequency reduced output signal $V_{FRO}$, and a binary counter data output QBC, which provides a binary count output signal BCOUNT. Each cycle of the frequency reduced output signal $V_{FRO}$ may increment the binary counter 58. The value of the binary counter 58 is provided from the binary counter data output QBC, which may include multiple data bits. The binary count output signal BCOUNT feeds a first data input DF of a first register 60, which includes a first data output QF and a first clock input CLKF. The first reference signal $V_{REF1}$ feeds the first clock input CLKF. On an edge of the first reference signal $V_{REF1}$, the value of the binary counter 58 is clocked into the first register 60, and then appears at the first data output QF, which provides a first count signal PHASE0. It will be appreciated by those skilled in the art that additional embodiments may replace the binary counter 58 with a Gray code counter or other digital sequence generating circuit with a decoding circuit to provide an equivalent measure of the elapsed count.

The first count signal PHASE0 feeds a first summing input SM of a first summing and difference circuit 62 and a second data input DS of a second register 64, which includes a second data output QS and a second clock input CLKS. The first reference signal $V_{REF1}$ feeds the second clock input CLKS. On a subsequent edge of the first reference signal $V_{REF1}$, the value of the binary counter 58 that was previously clocked into the first register 60 is clocked into the second register 64, and then appears at the second data output QS, which provides a second count signal PHASE1. The second count signal PHASE1 feeds a first difference input DF of the first summing and difference circuit 62, which provides an output signal based on a difference between a signal at the first summing input SM and a signal at the first difference input DF.

At any time after an edge of the first reference signal $V_{REF1}$, such that the first and second data outputs QF, QS have had time to stabilize, the difference between the first count signal PHASE0 and the second count signal PHASE1 is approximately equal to the number of cycles of the frequency reduced output signal $V_{FRO}$ counted between the two edges of the first reference signal $V_{REF1}$. The number of cycles counted is proportional to the frequency of the frequency reduced output signal $V_{FRO}$; therefore, the output signal, called a measured frequency signal FMEAS, from the first summing and difference circuit 62 is proportional to the frequency of the frequency reduced output signal $V_{FRO}$. The measured frequency signal FMEAS feeds a second summing input SM of a second summing and difference circuit 66. The desired frequency signal DFREQ feeds a second difference input DF of the second summing and difference circuit 66, which provides the frequency error signal $V_{FES}$ based on a difference between the measured frequency signal FMEAS and the desired frequency signal DFREQ.

Since the frequency reduced output signal $V_{FRO}$ is typically not synchronized with the first reference signal $V_{REF1}$, one or more bits in the binary count output signal BCOUNT may be changing when clocked into the first register 60; therefore, an erroneous value of the binary counter 58 may be clocked into the first register 60. If the binary counter 58 was changing from a value with multiple "1s" to a value with multiple "0s," such as 0111 to 1000, the clocked value of the binary counter 58 could be in error by multiple bits.

Figure 11:
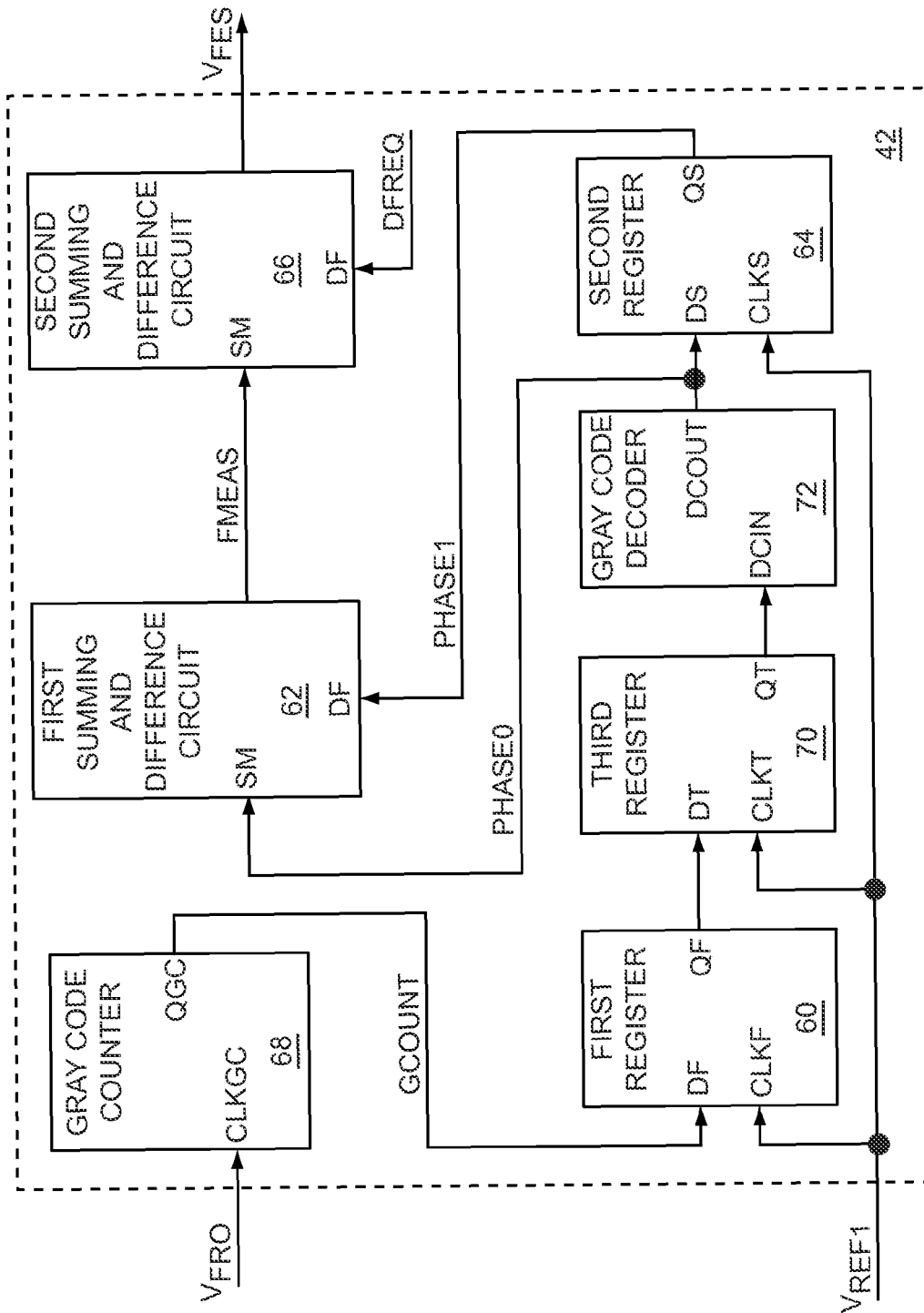
FIG. 11 shows details of the FLL frequency detector illustrated in FIG. 8 according to an alternate embodiment of the FLL frequency detector.

FIG. 11 shows details of the FLL frequency detector 42 illustrated in FIG. 8 according to an alternate embodiment of the FLL frequency detector 42. The binary counter 58 is replaced with a Gray code counter 68, which has a Gray code counter clock input CLKGC that receives the frequency reduced output signal $V_{FRO}$, and a Gray code counter data output QGC, which provides a Gray code count output signal GCOUNT. Each cycle of the frequency reduced output signal $V_{FRO}$ may increment the Gray code counter 68. The value of the Gray code counter 68 is provided from the Gray code counter data output QGC, which may include multiple data bits. The Gray code counter 68 is a binary counter that provides a Gray code output, which changes only one bit for each incremental value of the Gray code counter 68; therefore, any count errors introduced due to asynchronous clocking of registers receiving the Gray code count output signal GCOUNT will result in a maximum count error of one bit. The Gray code count output signal GCOUNT feeds the first data input DF of the first register 60.

The first data output QF of the first register 60 feeds a third data input DT of a third register 70, which includes a third data output QT and a third clock input CLKT. The first reference signal $V_{REF1}$ feeds the third clock input CLKT. On a subsequent edge of the first reference signal $V_{REF1}$, the value of the Gray code counter 68 that was previously clocked into the first register 60 is clocked into the third register 70, and then appears at the third data output QT. The third data output QT feeds a decoder input DCIN of a Gray code decoder 72, which converts a Gray code signal into a binary signal provided from a decoder output DCOUT, which provides the first count signal PHASE0. Additional embodiments of the present invention may include fewer or more flip-flops, coding systems other than a Gray code, at least one divider in series with the first frequency reference signal $V_{REF1}$, at least one divider in series with the frequency reduced output signal $V_{FRO}$, different frequency measuring systems, different frequency error measuring systems, or any combination thereof. A coding system may be used other than a Gray code system that still provides a single-bit change in its output value for each clocking event.

Figure 12:
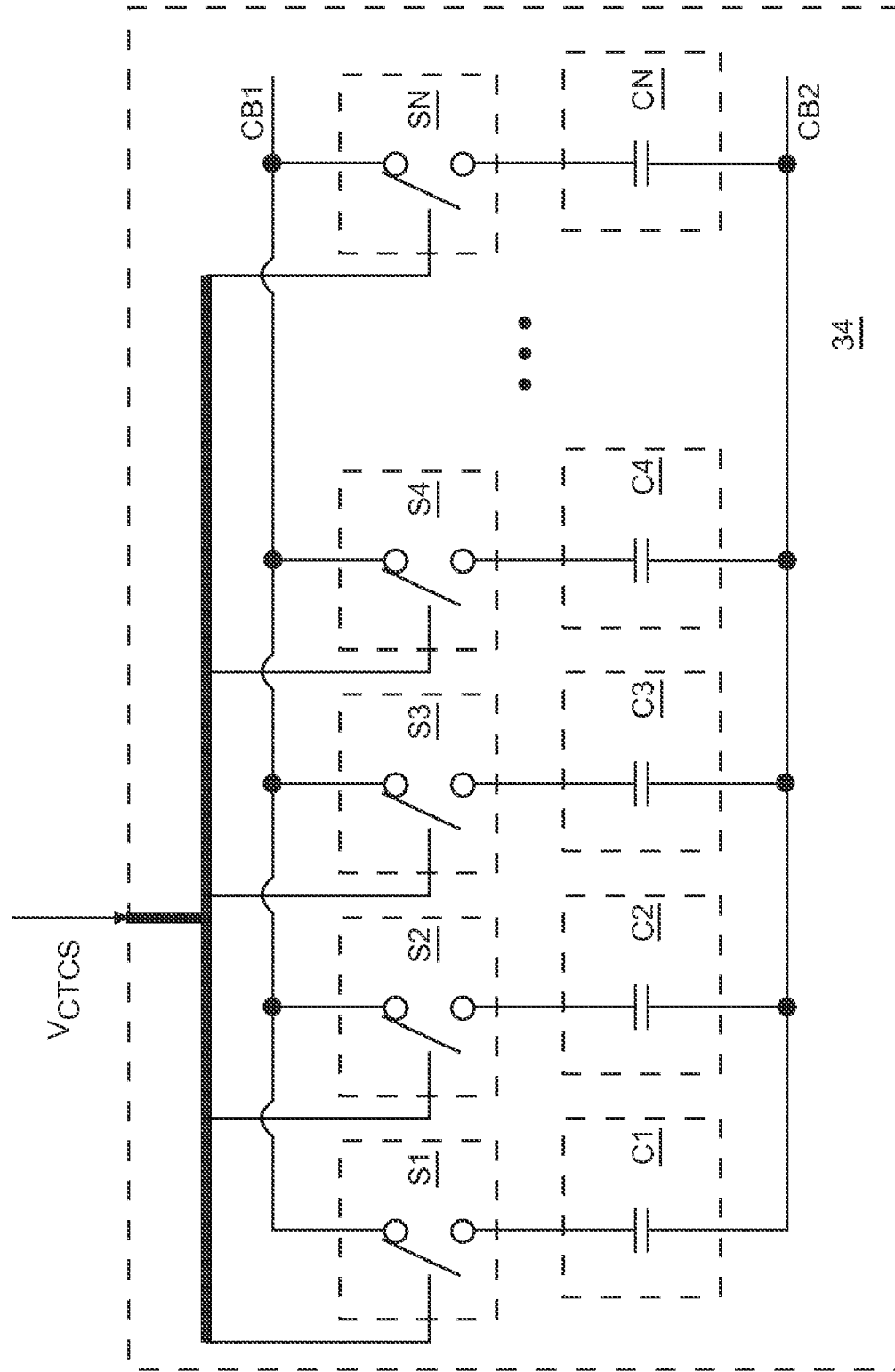
FIG. 12 shows details of discrete tuning elements circuitry illustrated in FIG. 8 according to one embodiment of the discrete tuning elements circuitry.

FIG. 12 shows details of the discrete tuning elements circuitry 34 illustrated in FIG. 8 according to one embodiment of the discrete tuning elements circuitry 34. The discrete tuning elements circuitry 34 may include N selectable capacitive elements that provide $N^2$ different selectable capacitance values for coarse tuning; therefore, the coarse tuning control signal $V_{CTCS}$ may include an N-bit digital signal having $N^2$ different values. A resonant frequency of the VFO 12 may be based on a capacitance of the discrete tuning elements circuitry 34, which includes a first capacitive element C1 coupled in series with a first switching element S1. The first elements C1, 51 are coupled between a first capacitor bank node CB1 and a second capacitor bank node CB2. A first bit of the coarse tuning control signal $V_{CTCS}$ controls the first switching element S1. Similarly, a second capacitive element C2 is coupled in series with a second switching element S2, a third capacitive element C3 is coupled in series with a third switching element S3, a fourth capacitive element C4 is coupled in series with a fourth switching element S4, up to and including an Nth capacitive element CN is coupled in series with an Nth switching element SN, respectively. The series coupled elements C1, S1, C2, S2, C3, S3, C4, S4, CN, SN are coupled between the first capacitor bank node CB1 and the second capacitor bank node CB2. Second, third, fourth, up to and including Nth bits of the coarse tuning control signal $V_{CTCS}$ control the second, third, fourth, up to and including the Nth switching elements S2, S3, S4, SN, respectively.

A capacitance of the second capacitive element C2 may be approximately two times a capacitance of the first capacitive element C1. A capacitance of the third capacitive element C3 may be approximately two times a capacitance of the second capacitive element C2, and so on. Alternate embodiments of the present invention may use a capacitor bank having any number of capacitive elements, capacitive elements having a binary weighting, as described above, capacitive elements having a non-binary weighting, capacitive elements having a constant incrementing or thermometer style weighting, or any combination thereof. Alternate embodiments of the present invention may use discrete capacitive tuning elements, as described above, discrete non-capacitive tuning elements, or both, for coarse tuning.

Figure 13:
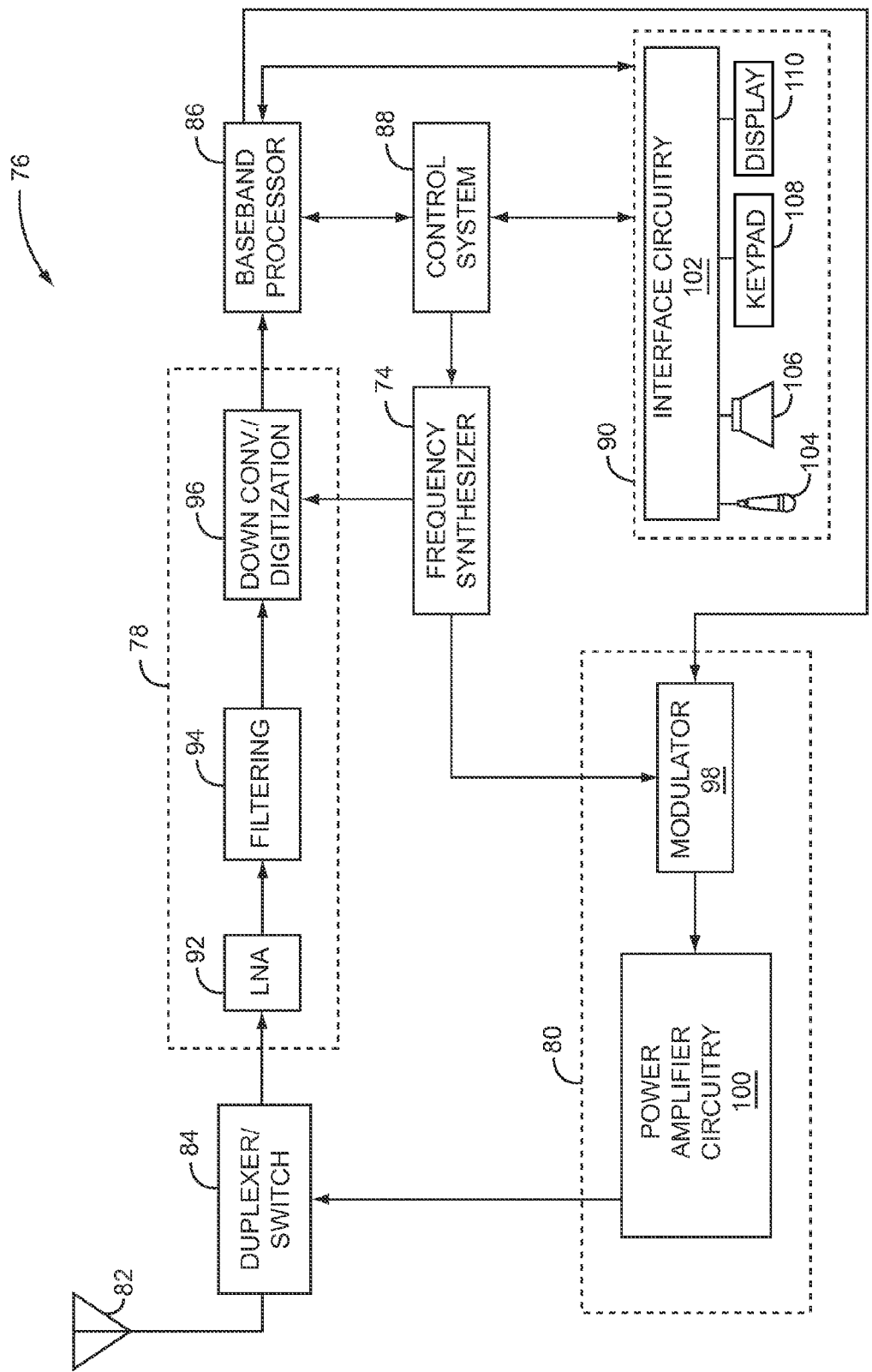
FIG. 13 shows an application example of the present invention used in a mobile terminal.

An application example of a calibrated PLL 10 is its use in a frequency synthesizer 74 in a mobile terminal 76, the basic architecture of which is represented in FIG. 13. The mobile terminal 76 may include a receiver front end 78, a radio frequency transmitter section 80, an antenna 82, a duplexer or switch 84, a baseband processor 86, a control system 88, the frequency synthesizer 74, and an interface 90. The receiver front end 78 receives information bearing radio frequency signals from one or more remote transmitters provided by a base station (not shown). A low noise amplifier (LNA) 92 amplifies the signal. Filtering 94 minimizes broadband interference in the received signal, while down conversion and digitization circuitry 96 down converts the filtered, received signal to an intermediate or baseband frequency signal, which is then digitized into one or more digital streams. The receiver front end 78 typically uses one or more mixing frequencies generated by the frequency synthesizer 74. The baseband processor 86 processes the digitized received signal to extract the information or data bits conveyed in the received signal. This processing typically comprises demodulation, decoding, and error correction operations. As such, the baseband processor 86 is generally implemented in one or more digital signal processors (DSPs).

On the transmit side, the baseband processor 86 receives digitized data, which may represent voice, data, or control information, from the control system 88, which it encodes for transmission. The encoded data is output to the transmitter 80, where it is used by a modulator 98 to modulate a carrier signal that is at a desired transmit frequency. Power amplifier circuitry 100 amplifies the modulated carrier signal to a level appropriate for transmission, and delivers the amplified and modulated carrier signal to the antenna 82 through the duplexer or switch 84.

A user may interact with the mobile terminal 76 via the interface 90, which may include interface circuitry 102 associated with a microphone 104, a speaker 106, a keypad 108, and a display 110. The interface circuitry 102 typically includes analog-to-digital converters, digital-to-analog converters, amplifiers, and the like. Additionally, the interface circuitry 102 may include a voice encoder/decoder, in which case it may communicate directly with the baseband processor 86. The microphone 104 will typically convert audio input, such as the user's voice, into an electrical signal, which is then digitized and passed directly or indirectly to the baseband processor 86. Audio information encoded in the received signal is recovered by the baseband processor 86, and converted by the interface circuitry 102 into an analog signal suitable for driving the speaker 106. The keypad 108 and the display 110 enable the user to interact with the mobile terminal 76, input numbers to be dialed, address book information, or the like, as well as monitor call progress information.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

Those skilled in the art will recognize improvements and modifications to the preferred embodiments of the present invention. All such improvements and modifications are considered within the scope of the concepts disclosed herein and the claims that follow.

What is claimed is:

1. A circuit comprising:
   a variable frequency oscillator (VFO) adapted to receive a control signal and provide an output signal based on the control signal, such that:
   during a first calibration mode, the output signal has a first calibration frequency;
   and during a phase-locked loop (PLL) mode, the output signal has a locked frequency;
   and loop control circuitry adapted to: during the first calibration mode, form a frequency-locked loop (FLL) using the VFO, and regulate the first calibration frequency based on a first calibration frequency setpoint by controlling the control signal, which is associated with a first control value, such that calibration information is based on the first control value and the first calibration frequency setpoint; and
   during the PLL mode, form a PLL using the VFO, and regulate the locked frequency based on a locked frequency setpoint by controlling the control signal, such that the PLL has a PLL loop gain, which is based on the calibration information; wherein:
   the loop control circuitry is further adapted to receive a first reference signal having a reference frequency and a second reference signal having a reference phase;
   the regulation of the first calibration frequency is further based on a frequency difference associated with the first calibration frequency and the reference frequency;
   during the PLL mode, the output signal has the locked frequency and a locked phase; and
   the regulation of the locked frequency is further based on a phase difference associated with the locked phase and the reference phase;
   wherein the loop control circuitry comprises a frequency reduction circuit adapted to:
   receive the output signal; and
   provide a frequency reduced output signal based on applying a frequency reduction to the output signal, wherein:

during the first calibration mode, the frequency reduced output signal has a first reduced calibration frequency;
the regulation of the first calibration frequency is further based on a frequency difference associated with the first reduced calibration frequency and the reference frequency;
during the PLL mode, the frequency reduced output signal has a reduced locked frequency and a reduced frequency locked phase;
the regulation of the locked frequency is further based on a phase difference associated with the reduced frequency locked phase and the reference phase;
a calibration division ratio is about equal to the first calibration frequency divided by the first reduced calibration frequency;
a PLL division ratio is about equal to the locked frequency divided by the reduced locked frequency; and
a PLL-to-calibration ratio is about equal to the PLL division ratio divided by the calibration division ratio.

2. The circuit of claim 1 wherein the PLL-to-calibration ratio is equal to about a power of two.

3. The circuit of claim 1 wherein:
during the first calibration mode, the FLL has an FLL bandwidth; and
during the PLL mode, the PLL has a PLL bandwidth, such that the FLL bandwidth is greater than the PLL bandwidth.

4. The circuit of claim 1 wherein:
during a coarse tuning mode, the output signal has a coarse tuning frequency; and
the loop control circuitry is further adapted to, during the coarse tuning mode, form the FLL using the VFO, and regulate the coarse tuning frequency based on a coarse tuning frequency setpoint.

5. The circuit of claim 4 wherein the coarse tuning mode is followed by the first calibration mode.

6. The circuit of claim 4 wherein:
the regulation of the coarse tuning frequency is controlled by a coarse tuning signal; and
the VFO is further adapted to receive the coarse tuning signal, such that the output signal is further based on the coarse tuning signal.

7. The circuit of claim 6 wherein the VFO further comprises a plurality of discrete tuning elements and is further adapted to select at least one of the plurality of discrete tuning elements based on the coarse tuning signal, and the output signal is further based on the selection of the at least one of the plurality of discrete tuning elements.

8. The circuit of claim 7 wherein the plurality of discrete tuning elements comprises a plurality of capacitive elements.

9. The circuit of claim 6 wherein the loop control circuitry is further adapted to hold the coarse tuning signal about constant during the first calibration mode and during the PLL mode.

10. The circuit of claim 1 further comprising control circuitry adapted to select one of the first calibration mode and the PLL mode.

11. The circuit of claim 1 wherein the PLL division ratio is based on the locked frequency setpoint and the calibration division ratio is based on the first calibration frequency setpoint.

12. The circuit of claim 1 wherein the frequency reduction circuit is a fractional-N divider.

13. The circuit of claim 1 wherein the frequency reduction circuit comprises a mixer.

14. The circuit of claim 1 wherein:
the VFO is further adapted to receive the control signal and provide the output signal based on the control signal, such that during a second calibration mode, the output signal has a second calibration frequency; and
the loop control circuitry is further adapted to, during the second calibration mode, form the FLL using the VFO, and regulate the second calibration frequency based on a second calibration frequency setpoint by controlling the control signal, which is associated with a second control value, such that the calibration information is further based on the first control value and the second calibration frequency setpoint.

15. The circuit of claim 14 wherein the second calibration frequency is a desired operating frequency.

16. The circuit of claim 14 wherein one of the first calibration frequency and the second calibration frequency is greater than a desired operating frequency and another of the first calibration frequency and the second calibration frequency is less than the desired operating frequency.

17. The circuit of claim 1 wherein the loop control circuitry further comprises:
a PLL phase detector adapted to:
receive the frequency reduced output signal and the second reference signal; and
during the PLL mode, provide a phase error signal based on a phase difference between the frequency reduced output signal and the second reference signal, such that the regulation of the locked frequency is further based on the phase error signal; and
a charge pump adapted to:
receive the phase error signal; and
during the PLL mode, provide a charge pump output signal based on a charge pump current and the phase error signal, such that the regulation of the locked frequency is further based on the charge pump signal, and the PLL loop gain is based on the charge pump current.

18. The circuit of claim 17 wherein:
during the first calibration mode, the VFO has a tuning gain based on a relationship between the first control value and the first calibration frequency setpoint;
the calibration information is based on the tuning gain;
during the PLL mode, the PLL loop gain is based on a product of the tuning gain and the charge pump current; and
during the PLL mode, the loop control circuitry is further adapted to set the charge pump current based on the calibration information.

19. The circuit of claim 18 wherein during the PLL mode, the loop control circuitry is further adapted to set the charge pump current to approximately maintain a constant PLL loop gain over operating conditions of the circuit.

20. The circuit of claim 18 wherein the loop control circuitry further comprises an FLL frequency detector adapted to:
receive the frequency reduced output signal and the first reference signal; and
during the first calibration mode, provide a frequency error signal based on a frequency difference between the frequency reduced output signal and the first reference signal, such that the regulation of the first calibration frequency is further based on the frequency error signal.

21. The circuit of claim 20 wherein the loop control circuitry further comprises a PLL gain calibration circuit adapted to:
receive the frequency error signal;

during the first calibration mode, provide the first control value based on the frequency error signal; and during the first calibration mode, provide a digital-to-analog converter (DAC) output signal based on the first control value, such that the controlling of the control signal is based on the DAC output signal.

22. The circuit of claim 21 wherein the PLL gain calibration circuit comprises a PLL gain calibration loop filter adapted to:

receive the frequency error signal;

during the first calibration mode, provide the first control value based on filtering the frequency error signal; and during the first calibration mode, provide the DAC output signal.

23. The circuit of claim 22 wherein:

during a coarse tuning mode, the output signal has a coarse tuning frequency;

the loop control circuitry is further adapted to, during the coarse tuning mode, form the FLL using the VFO, and regulate the coarse tuning frequency based on a coarse tuning frequency setpoint by controlling a coarse tuning signal; and the VFO is further adapted to receive the coarse tuning signal, such that the output signal is further based on the coarse tuning signal.

24. The circuit of claim 22 wherein the loop control circuitry further comprises an FLL loop filter adapted to:

receive the frequency error signal; and during the coarse tuning mode, provide the coarse tuning signal based on filtering the frequency error signal.

25. The circuit of claim 1 wherein the circuit is used to form a frequency synthesizer in a wireless communications system.

* * * * *